(12) United States Patent
Suzuki et al.

(10) Patent No.: US 12,339,326 B2
(45) Date of Patent: Jun. 24, 2025

(54) DETERIORATION DIAGNOSIS APPARATUS OF ASSEMBLED BATTERY AND DETERIORATION DIAGNOSIS METHOD OF ASSEMBLED BATTERY

(71) Applicant: TOYOTA JIDOSHA KABUSHIKI KAISHA, Toyota (JP)

(72) Inventors: Kentaro Suzuki, Kariya (JP); Koji Yamada, Kusatsu (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 468 days.

(21) Appl. No.: 17/890,736

(22) Filed: Aug. 18, 2022

(65) Prior Publication Data
US 2023/0132434 A1 May 4, 2023

(30) Foreign Application Priority Data
Nov. 4, 2021 (JP) .................... 2021-180364

(51) Int. Cl.
*G01R 31/392* (2019.01)
*G01R 31/36* (2020.01)
(Continued)

(52) U.S. Cl.
CPC ....... *G01R 31/392* (2019.01); *G01R 31/3647* (2019.01); *G01R 31/388* (2019.01);
(Continued)

(58) Field of Classification Search
CPC ...... G01R 31/392; G01R 31/36; G01R 31/00; G01R 31/3647; G01R 31/3644;
(Continued)

(56) References Cited

U.S. PATENT DOCUMENTS

| 6,472,875 B1 * | 10/2002 | Meyer .............. G01R 19/16542 |
| | | 324/426 |
| 2013/0132011 A1 | 5/2013 | Mano et al. |
| 2014/0214251 A1 | 7/2014 | Sugiyama |
| 2017/0072811 A1 * | 3/2017 | Tabatowski-Bush ........................ |
| | | G01R 31/3835 |

(Continued)

FOREIGN PATENT DOCUMENTS

| JP | 2008-094178 A | 4/2008 |
| JP | 2011-061955 A | 3/2011 |

(Continued)

*Primary Examiner* — Mohamed Charioui
(74) *Attorney, Agent, or Firm* — Dinsmore & Shohl LLP

(57) ABSTRACT

A deterioration diagnosis apparatus of an assembled battery includes at least one processor. The processor executes discharging of each of a plurality of cells included in an assembled battery mounted on a vehicle while measuring a voltage of each of the cells, and estimates a deterioration degree of the assembled battery using voltage data indicating a transition of a voltage of at least one of the cells from a discharging start voltage to a predetermined discharging end voltage. The vehicle includes an internal combustion engine and a motor that executes start processing of the internal combustion engine. The assembled battery supplies power to the motor. The processor determines, during the discharging, whether the assembled battery becomes unable to supply power required for the start processing to the motor when the discharging is continued, and ends the discharging before the assembled battery becomes unable to supply the power to the motor.

10 Claims, 10 Drawing Sheets

(51) Int. Cl.
*G01R 31/388* (2019.01)
*G01R 31/396* (2019.01)
*H01M 10/44* (2006.01)

(52) U.S. Cl.
CPC .......... *G01R 31/396* (2019.01); *H01M 10/44* (2013.01); *H01M 2220/20* (2013.01)

(58) Field of Classification Search
CPC ................ G01R 31/388; G01R 31/387; G01R 31/385; G01R 31/396; G01R 31/007; H01M 10/44; H01M 10/00; H01M 2220/20; H01M 2010/4271; H01M 10/42; H01M 10/48; B60L 2240/547; B60L 50/61; B60L 50/60; B60L 50/50; B60L 50/00; B60L 58/16; B60L 58/10; B60L 58/00; B60L 3/0046
See application file for complete search history.

(56) References Cited

U.S. PATENT DOCUMENTS

| | | | |
|---|---|---|---|
| 2017/0259687 A1* | 9/2017 | Chikkannanavar | ......................... H02J 7/00308 |
| 2021/0143518 A1* | 5/2021 | Zhou | .................... H01M 50/204 |
| 2021/0263104 A1* | 8/2021 | Zhu | ..................... H01M 10/486 |
| 2021/0263108 A1* | 8/2021 | Li | ....................... H01M 10/052 |
| 2021/0367277 A1 | 11/2021 | Takechi | |

FOREIGN PATENT DOCUMENTS

| | | |
|---|---|---|
| JP | 2013-110906 A | 6/2013 |
| JP | 2014-143868 A | 8/2014 |
| JP | 2020-038812 A | 3/2020 |
| WO | 2011/145213 A1 | 11/2011 |
| WO | 2019/230069 A1 | 12/2019 |

* cited by examiner

DETERIORATION DIAGNOSIS APPARATUS OF ASSEMBLED BATTERY AND DETERIORATION DIAGNOSIS METHOD OF ASSEMBLED BATTERY

CROSS-REFERENCE TO RELATED APPLICATION

This application claims priority to Japanese Patent Application No. 2021-180364 filed on Nov. 4, 2021, incorporated herein by reference in its entirety.

BACKGROUND

1. Technical Field

The present disclosure relates to a deterioration diagnosis apparatus of an assembled battery and a deterioration diagnosis method of an assembled battery.

2. Description of Related Art

An assembled battery includes a plurality of secondary batteries electrically connected to each other. By combining the secondary batteries, a large-capacity assembled battery can be obtained. However, a full charge capacity (an electricity amount accumulated in the secondary battery at a time of full charging) of a secondary battery decreases as the secondary battery deteriorates. For example, Japanese Unexamined Patent Application Publication No. 2013-110906 (JP 2013-110906 A) discloses a deterioration diagnosis method of an assembled battery that executes discharging until a voltage (a voltage between terminals) of the assembled battery reaches a predetermined discharging end voltage, and estimates a deterioration degree of the assembled battery using data (a discharging curve) indicating a transition of the voltage of the assembled battery during the discharging.

SUMMARY

In the deterioration diagnosis method of the assembled battery described in JP 2013-110906 A, the discharging end voltage is set in advance so as to ensure sufficient diagnosis accuracy while avoiding over-discharging of the assembled battery. The over-discharging of the assembled battery means excessive discharging to an extent that deterioration of the assembled battery progresses.

When the deterioration diagnosis of the assembled battery is executed by the method described in JP 2013-110906 A in a vehicle including an internal combustion engine, a motor that executes start processing (for example, cranking) of the internal combustion engine, and an assembled battery that supplies power to the motor, discharging of the assembled battery may be continued even when the assembled battery becomes unable to supply power required for the start processing of the internal combustion engine to the motor. For this reason, it may take time and effort to charge the assembled battery with an external power source (a power source outside the vehicle) after an end of the diagnosis.

The present disclosure provides a deterioration diagnosis apparatus and a deterioration diagnosis method of an assembled battery that can easily execute start processing of an internal combustion engine after discharging for the deterioration diagnosis of the assembled battery is executed in a vehicle including an internal combustion engine, a motor that executes the start processing of the internal combustion engine, and an assembled battery that supplies power to the motor.

A deterioration diagnosis apparatus of the assembled battery according to a first aspect of the present disclosure includes at least one processor. The at least one processor is configured to execute discharging of each of a plurality of cells included in the assembled battery mounted on a vehicle while measuring a voltage of each of the cells, and estimate a deterioration degree of the assembled battery using voltage data indicating a transition of a voltage of at least one of the cells from a discharging start voltage to a predetermined discharging end voltage. The vehicle includes an internal combustion engine and a motor that executes start processing of the internal combustion engine. The assembled battery is configured to supply power to the motor. The at least one processor is configured to determine, during the discharging of each of the cells, whether the assembled battery becomes unable to supply power required for the start processing to the motor when the discharging is continued, and end the discharging before the assembled battery becomes unable to supply the power required for the start processing to the motor.

With the above configuration, the discharging is ended before the assembled battery becomes unable to supply the power required for the start processing to the motor. For this reason, the motor can receive power supplied from the assembled battery after an end of the discharging and execute the start processing of the internal combustion engine. As such, with the deterioration diagnosis apparatus of the assembled battery, it is possible to easily execute the start processing of the internal combustion engine after the discharging for the deterioration diagnosis of the assembled battery is executed.

The cell is a secondary battery composing the assembled battery. The assembled battery is composed of the cells electrically connected to each other. The start processing is processing for starting the internal combustion engine. The internal combustion engine can be started by receiving assistance from the motor. The start processing may be cranking. The cranking is to start the internal combustion engine by rotating a crankshaft of the internal combustion engine.

In the first aspect, the at least one processor may be configured to, during the discharging of each of the cells, at a time at which an average value or a median value of voltages of all the cells included in the assembled battery becomes a predetermined value or lower, determine that the assembled battery becomes unable to supply the power required for the start processing to the motor when the discharging is continued after the time, and end the discharging.

With the above configuration, it is easy for the at least one processor to accurately determine whether the assembled battery becomes unable to supply the power required for the start processing to the motor when the discharging is continued. Further, since the average value or the median value of the voltages of all the cells is used for the determination, a sensor that measures a voltage between terminals of the assembled battery is unnecessary. The predetermined value may be a voltage value required for the motor to execute the start processing of the internal combustion engine. The predetermined value may be a fixed value or may be variable depending on a situation.

In the first aspect, the at least one processor may be configured to end the discharging when any of the following first end condition and second end condition is satisfied. The first end condition may be satisfied when voltages of all the cells included in the assembled battery reach the discharging end voltage, and the second end condition may be satisfied when a determination is made that the assembled battery becomes unable to supply the power required for the start processing to the motor when the discharging is continued. When the discharging is ended by the satisfaction of the first end condition, the at least one processor may estimate the deterioration degree of the assembled battery using voltage data of all the cells included in the assembled battery. When the discharging is ended by the satisfaction of the second end condition, the at least one processor may estimate the deterioration degree of the assembled battery using voltage data of a cell of which a voltage reaches the discharging end voltage before the end of the discharging.

In the deterioration diagnosis apparatus of the assembled battery, when the discharging is ended by the satisfaction of the first end condition, it is possible to estimate, with high accuracy, the deterioration degree of the assembled battery using the voltage data of all the cells included in the assembled battery. Further, when the second end condition is satisfied, the discharging is ended even when a voltage of any cell included in the assembled battery does not reach the discharging end voltage. As such, the case where the assembled battery becomes unable to supply the power required for the start processing of the internal combustion engine to the motor is restricted from occurring. Therefore, when the discharging is ended by the satisfaction of the second end condition, it is possible to estimate the deterioration degree of the assembled battery using the voltage data of the cell of which the voltage reaches the discharging end voltage before the end of the discharging.

A life of the assembled battery is often decided by a deterioration degree of a secondary battery (hereinafter, also referred to as a "minimum capacity cell") having the smallest full charge capacity from among the cells included in the assembled battery. Then, when the second end condition is satisfied, it is highly possible that a voltage of the minimum capacity cell has already reached the discharging end voltage. For this reason, when the discharging is ended by the satisfaction of the second end condition, it is also considered that the life of the assembled battery can be determined with sufficient accuracy.

In the first aspect, the at least one processor may be configured to end the discharging even when the following third end condition is satisfied. The third end condition may be satisfied when a voltage of any cell included in the assembled battery reaches a predetermined voltage. The predetermined voltage may be lower than the discharging end voltage.

With the above configuration, at least one of deterioration and abnormality in the cell is restricted. The predetermined voltage may be set based on a discharging prohibition voltage (a lower limit voltage indicating that an abnormality may occur in the cell when the discharging is continued more than the lower limit voltage) common to the cells included in the assembled battery. The predetermined voltage may be set to match the discharging prohibition voltage, or may be set to be slightly higher than the discharging prohibition voltage. Further, the discharging end voltage may be set based on the discharging lower limit voltage (a lower limit voltage indicating that the deterioration of the cell may be accelerated when the discharging is continued more than the lower limit voltage) common to the cells included in the assembled battery. The discharging end voltage may be set to match the discharging lower limit voltage, or may be set to be slightly higher than the discharging lower limit voltage.

In the first aspect, the at least one processor may be configured to estimate a full charge capacity of each of the cells using the voltage data indicating a transition of a cell voltage from the discharging start voltage to the discharging end voltage, and classify the cells based on the estimated full charge capacity.

The full charge capacity of the cell decreases as the cell deteriorates. With the above configuration, it is easy to grasp a deterioration degree of each cell.

In the first aspect, the at least one processor may be configured to, based on the estimated full charge capacity, classify the cells into any of a first category, a second category having a larger full charge capacity than the first category, and a third category having a larger full charge capacity than the second category. Then, the at least one processor may determine that the assembled battery is new when all the cells of which the voltages reach the discharging end voltage before the end of the discharging are classified into the third category. The at least one processor may determine that use of the assembled battery in the vehicle is not continuable when at least one of the cells of which the voltages reach the discharging end voltage before the end of the discharging is classified into the first category.

With the above configuration, it is possible to determine whether a state of the assembled battery is any of a new state where the assembled battery is new, a state where the use of the assembled battery is continuable (replacement is not required), or a state where the use thereof is not continuable (replacement is required). As such, it is easy to easily and accurately grasp the deterioration degree of the assembled battery.

In the first aspect, the assembled battery may be configured to supply power to a power load mounted on a vehicle. The at least one processor may be configured to execute the discharging by controlling the power load.

With the above configuration, it is possible to easily and appropriately execute the deterioration diagnosis of the assembled battery for the vehicle. The power load controlled by the at least one processor during the discharging may include at least one of air conditioning equipment, a seat heater, and a lighting device.

In the first aspect, all the cells included in the assembled battery may be connected in series. The at least one processor may be configured to maintain a current value during the discharging of each of the cells.

With the above configuration, it is easy to match the current value during the discharging of each cell included in the assembled battery. As such, it is easy to estimate, with high accuracy, the deterioration degree of the assembled battery.

A deterioration diagnosis method of an assembled battery according to a second aspect of the present disclosure includes executing discharging of each of a plurality of cells included in the assembled battery while measuring a voltage of each of the cells, repeatedly determining, during the discharging of each of the cells, whether the assembled battery becomes unable to supply power required for start processing to a motor when the discharging is continued, ending the discharging upon determining, during the discharging of each of the cells, that the assembled battery becomes unable to supply the power required for the start processing to the motor when the discharging is continued, and estimating, after the end of the discharging, a deterioration degree of the assembled battery using voltage data, which is acquired during the discharging, of at least one of the cells. The deterioration diagnosis method is executed in a vehicle including an internal combustion engine, a motor that executes start processing of the internal combustion engine, and the assembled battery that supplies power to the motor.

In the same manner as the above-described deterioration diagnosis apparatus, with the deterioration diagnosis method of the assembled battery, it is possible to easily execute the start processing of the internal combustion engine after the discharging for the deterioration diagnosis of the assembled battery is executed.

In the second aspect, the deterioration diagnosis method may further include determining, using the estimated deterioration degree of the assembled battery, whether use of the assembled battery in the vehicle is continuable, executing, by the motor, the start processing of the internal combustion engine upon determining that the use of the assembled battery in the vehicle is continuable, and charging the assembled battery with power that is generated using drive power output from the started internal combustion engine.

With the above configuration, it is possible to easily charge the assembled battery that is discharged for the deterioration diagnosis.

A full charge capacity of the assembled battery in an initial state may be 5 kWh or smaller. When the capacity of the assembled battery is 5 kWh or smaller, the diagnosis with the sufficient throughput can be executed using the above-described deterioration diagnosis method due to the discharging. A full charge capacity of the assembled battery to be diagnosed in the initial state may be 0.1 kWh or larger and 5 kWh or smaller, or may be 0.3 kWh or larger and 3 kWh or smaller. The assembled battery to be diagnosed may be a drive battery mounted on a hybrid electric vehicle (HEV).

Hereinafter, the internal combustion engine mounted on the vehicle may be referred to as an "engine". The engine may be configured to generate a traveling driving power. The vehicle may further include a motor that receives power supplied from the assembled battery and generates the traveling driving power, apart from the motor that executes the start processing of the engine. The motor that executes the start processing of the engine may be configured to generate power using drive power that is output from the engine and supply the generated power to the assembled battery.

With each aspect of the present disclosure, it is possible to provide a deterioration diagnosis apparatus and a deterioration diagnosis method of an assembled battery that can easily execute start processing of an engine after discharging for the deterioration diagnosis of the assembled battery is executed in a vehicle including an internal combustion engine, a motor that executes the start processing of the internal combustion engine, and an assembled battery that supplies power to the motor.

BRIEF DESCRIPTION OF THE DRAWINGS

Features, advantages, and technical and industrial significance of exemplary embodiments will be described below with reference to the accompanying drawings, in which like signs denote like elements, and wherein.

DETAILED DESCRIPTION OF EMBODIMENTS

Figure 1:
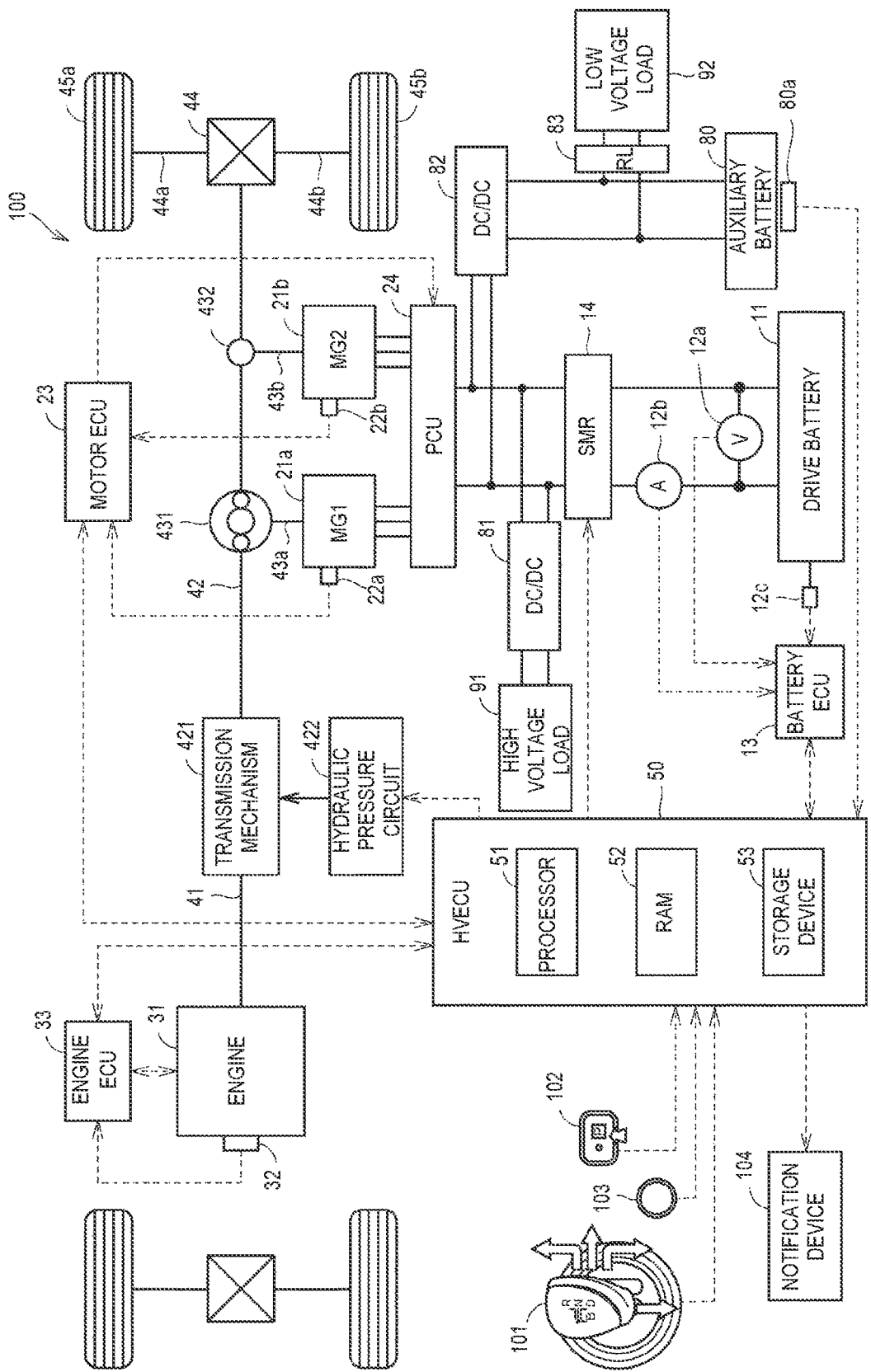
FIG. 1 is a diagram illustrating a configuration of a vehicle according to an embodiment of the present disclosure.

Embodiments of the present disclosure will be described in detail with reference to drawings. In the drawings, the same or corresponding parts are denoted by the same reference signs and the description thereof will not be repeated. Hereinafter, an electronic control unit is also referred to as an "ECU".

FIG. 1 is a diagram illustrating a configuration of a vehicle according to an embodiment. With reference to FIG. 1, a vehicle 100 is a hybrid electric vehicle (HEV). In this embodiment, it is assumed that the vehicle is a front-wheel drive four-wheel vehicle (more specifically, an HEV), but the number of wheels and a drive system can be appropriately changed. For example, the drive system may be four-wheel drive.

The vehicle 100 includes a drive battery 11, a voltage sensor 12a, a current sensor 12b, a temperature sensor 12c, a system main relay (SMR) 14, a first motor generator 21a (hereinafter, referred to as an "MG 21a"), a second motor generator 21b (hereinafter, referred to as an "MG 21b"), a power control unit (PCU) 24, an engine 31, a transmission mechanism 421, and a hydraulic pressure circuit 422.

The drive battery 11 includes a rechargeable secondary battery. The drive battery 11 is configured to supply power to the PCU 24 (and thus the MGs 21a, 21b). In this embodiment, an assembled battery including a plurality of secondary batteries that are electrically connected to each other is employed as the drive battery 11. A full charge capacity of the drive battery 11 in an initial state may be, for example, approximately 1.5 kWh. The secondary batteries included in the drive battery 11 may be modularized by a predetermined number. The assembled battery may be composed by combining a plurality of modules. The number of secondary batteries included in the drive battery 11 may be 10 or more and less than 100, or may be 100 or more. In this embodiment, the number of secondary batteries included in the drive battery 11 is approximately 50. The drive battery 11 is assembled in a form of a battery pack on, for example, a floor panel of the vehicle 100. In this embodiment, the battery pack is formed by installing accessories (a voltage sensor 12*a*, a current sensor 12*b*, a temperature sensor 12*c*, a battery ECU 13, an SMR 14, and the like) in a battery case that accommodates the drive battery 11.

Each secondary battery included in the assembled battery is referred to as a "cell". In this embodiment, all the cells included in the assembled battery are connected in series (see, for example, FIG. 2 described below). In this embodiment, a liquid system lithium-ion secondary battery is employed as a cell. However, examples of the cell are not limited thereto, and an all-solid-state secondary battery may be employed as a cell. Further, examples of the cell are not limited to the lithium-ion secondary battery, and may include other secondary batteries (for example, a nickel-hydrogen battery). Examples of the form of assembling the drive battery 11 in the vehicle 100 are not limited to the battery pack, and may include a packless form.

The voltage sensor 12*a* detects a voltage of each cell of the drive battery 11. The current sensor 12*b* detects current flowing through the drive battery 11. The temperature sensor 12*c* detects a temperature of each cell of the drive battery 11. Each sensor outputs a detection result to the battery ECU 13. The battery ECU 13 calculates a State of Charge (SOC) of each cell and an SOC of the drive battery 11 using the detection result of each sensor. The SOC indicates a remaining accumulated power amount and represents a ratio of, for example, a current accumulated power amount to an accumulated power amount in a fully charged state from 0% to 100%. The current sensor 12*b* is provided in a current path of the drive battery 11. In this embodiment, one voltage sensor 12*a* and one temperature sensor 12*c* are provided to each cell.

The SMR 14 is configured to switch between connection/disconnection of the current path that connects the PCU 24 to the drive battery 11. As the SMR 14, for example, an electromagnetic mechanical relay can be employed. When the SMR 14 is in a closed state (a connected state), power can be sent and received between the drive battery 11 and the PCU 24. On the other hand, when the SMR 14 is in an open state (a disconnected state), the current path that connects the drive battery 11 to the PCU 24 is disconnected. The SMR 14 is controlled by an HVECU 50. The SMR 14 is switched to the closed state when, for example, the vehicle 100 is traveling.

Each of the MGs 21*a* and 21*b* is a motor generator that has both a function as a motor that outputs torque by receiving supply of driving power and a function as a generator that generates generated power by receiving torque. As each of the MGs 21*a* and 21*b*, an alternating current motor (for example, a permanent magnet type synchronous motor or an induction motor) is used. Each of the MGs 21*a* and 21*b* is electrically connected to the drive battery 11 via the PCU 24. The MGs 21*a*, 21*b* have rotor shafts 43*a*, 43*b*, respectively. The rotor shafts 43*a*, 43*b* correspond to rotation shafts of the MGs 21*a*, 21*b*, respectively.

The vehicle 100 further includes a single pinion type planetary gear 431. An output shaft 41 of the engine 31 is connected to the planetary gear 431 through the transmission mechanism 421. As the engine 31, any internal combustion engine can be employed, but in this embodiment, as the engine 31, a spark-ignition type internal combustion engine including a plurality of cylinders (for example, four cylinders) is employed. The engine 31 generates drive power by combusting fuel (for example, gasoline) in each cylinder, and rotates a crankshaft (not shown) common to all cylinders using the generated drive power. The crankshaft of the engine 31 is connected to the output shaft 41 via a torsional damper (not shown). As the crankshaft rotates, the output shaft 41 also rotates. An example of the engine 31 is not limited to a gasoline engine, and may include a diesel engine or a hydrogen engine.

The output shaft 41 of the engine 31 corresponds to an input shaft of the transmission mechanism 421. The transmission mechanism 421 includes a clutch and a brake (neither shown), and is configured to change a gear ratio (that is, a ratio of rotation speed of the input shaft of the transmission mechanism 421 to rotation speed of an output shaft 42 of the transmission mechanism 421) depending on states (engagement/disengagement) of the clutch and the brake. The hydraulic pressure circuit 422 is configured to adjust hydraulic pressure supplied to each of the clutch and the brake included in the transmission mechanism 421 according to a command from the HVECU 50. The HVECU 50 may switch the state (engagement/disengagement) of each of the clutch and the brake included in the transmission mechanism 421 by controlling the hydraulic pressure circuit 422. In the configuration illustrated in FIG. 1, the transmission mechanism 421 is positioned on the upstream side (the planetary gear 431) of a power split device, but the transmission mechanism 421 may be positioned on the downstream side (the side close to drive wheels 45*a*, 45*b*).

The vehicle 100 further includes a shift lever 101 and a P position switch 102. Each of the shift lever 101 and the P position switch 102 is configured to be able to switch between a plurality of shift ranges according to a shift operation of a user. The user can select any of a neutral (N) range, a reverse (R) range, a drive (D) range, and a brake (B) range by moving the shift lever 101 to a predetermined position. Further, the user can select a parking (P) range by stopping the vehicle 100 and pressing the P position switch 102. The HVECU 50 switches the shift range of the vehicle 100 to a range selected by the user. The HVECU 50 controls the hydraulic pressure circuit 422 according to, for example, the shift range.

Each of the output shaft 42 of the transmission mechanism 421 and the rotor shaft 43*a* of the MG 21*a* is connected to the planetary gear 431. The planetary gear 431 has three rotating elements, that is, an input element, an output element, and a reaction force element. More specifically, the planetary gear 431 has a sun gear, a ring gear coaxially arranged with the sun gear, a pinion gear that meshes with the sun gear and the ring gear, and a carrier that holds the pinion gear such that it can rotate and revolve. The carrier corresponds to the input element, the ring gear corresponds to the output element, and the sun gear corresponds to the reaction force element.

The output shaft 42 of the transmission mechanism 421 is connected to the carrier of the planetary gear 431. The rotor shaft 43*a* of the MG 21*a* is connected to the sun gear of the planetary gear 431. Torque is input from the output shaft 42 of the transmission mechanism 421 to the carrier of the planetary gear 431. The planetary gear 431 is configured to, when the transmission mechanism 421 is in a non-neutral state (that is, a state of transferring the drive power), divide and transfer the torque output by the engine 31 to the sun gear (and thus the MG 21*a*) and the ring gear. When the torque output by the engine 31 is output to the ring gear, a reaction force torque output by the MG 21a acts on the sun gear.

The planetary gear 431 and the MG 21b are configured to combine drive power output from the planetary gear 431 (that is, drive power output to the ring gear) and drive power output from the MG 21b (that is, drive power output to the rotor shaft 43b) and transfer the combined power to drive wheels 45a, 45b. More specifically, an output gear (not shown) that meshes with a driven gear 432 is installed at the ring gear of the planetary gear 431. Further, a drive gear (not shown) installed at the rotor shaft 43b of the MG 21b also meshes with the driven gear 432. The driven gear 432 acts to combine torque output by the MG 21b to the rotor shaft 43b with torque output from the ring gear of the planetary gear 431. The drive torque combined as above is transferred to a differential gear 44, and further transferred to the drive wheels 45a, 45b via the drive shafts 44a, 44b extending to the right and left from the differential gear 44.

The vehicle 100 further includes a battery ECU 13, a motor ECU 23, an engine ECU 33, and an HVECU 50. In this embodiment, a computer (for example, a microcomputer) is employed as each of the battery ECU 13, the motor ECU 23, the engine ECU 33, and the HVECU 50. The ECUs are connected to each other in a manner capable of executing CAN communication therebetween.

The HVECU 50 includes a processor 51, a random access memory (RAM) 52, and a storage device 53. As the processor 51, for example, a central processing unit (CPU) can be employed. The RAM 52 functions as a working memory that temporarily stores data processed by the processor 51. The storage device 53 is configured to be able to retain the stored information. In addition to the program, the storage device 53 stores information (for example, a map, a mathematical formula, and various parameters) used in the program. When the processor 51 executes the program stored in the storage device 53, various processes are executed in the HVECU 50.

Although FIG. 1 illustrates a detailed configuration of only the HVECU 50, each of the other ECUs also includes a processor, a RAM, and a storage device. The number of processors included in each ECU is arbitrary, and any ECU may include a plurality of processors. Further, various processes in each ECU are not limited to execution by software, and may be executed by dedicated hardware (an electronic circuit).

Motor sensors 22a, 22b that detect states (for example, current, a voltage, a temperature, and rotation speed) of the MGs 21a, 21b are provided in the MGs 21a, 21b, respectively. Each of the motor sensors 22a, 22b outputs a detection result to the motor ECU 23. An engine sensor 32 that detects a state (for example, an air intake amount, air intake pressure, an air intake temperature, exhaust pressure, an exhaust temperature, a catalyst temperature, an engine coolant temperature, and rotation speed) of the engine 31 is provided in the engine 31. The engine sensor 32 outputs a detection result to the engine ECU 33. The HVECU 50 receives detection values of the motor sensors 22a, 22b and the engine sensor 32 from the motor ECU 23 and the engine ECU 33, as necessary. Further, the HVECU 50 receives a state (for example, a cell voltage, current, and a temperature, and the SOC) of the drive battery 11 from the battery ECU 13, as necessary.

The vehicle 100 includes a monitoring unit 80a that detects a state of an auxiliary battery 80 described below. The monitoring unit 80a includes various sensors that detect a state (for example, a temperature, current, a voltage) of the auxiliary battery 80, and outputs a detection result to the HVECU 50. The HVECU 50 can acquire the state (for example, the temperature, current, the voltage, and an SOC) of the auxiliary battery 80 based on an output of the monitoring unit 80a. Further, although not shown, other sensors (for example, a vehicle speed sensor, a fuel gauge, an odometer, an accelerator operation amount sensor, and an atmospheric pressure sensor) that indicate a situation of the vehicle 100 are also mounted on the vehicle 100. The HVECU 50 can grasp information of the vehicle 100 based on outputs of various sensors (in-vehicle sensors) mounted on the vehicle 100.

The HVECU 50 is configured to output a command (a control command) for controlling the engine 31 to the engine ECU 33. The engine ECU 33 is configured to control various actuators (for example, a throttle valve, an ignition device, and an injector) (none of them shown) of the engine 31 according to the command from the HVECU 50. The HVECU 50 can control the engine through the engine ECU 33.

The HVECU 50 is configured to output a command (a control command) for controlling each of the MG 21a and the MG 21b to the motor ECU 23. The motor ECU 23 is configured to generate a current signal (for example, a signal indicating a magnitude and frequency of current) corresponding to a target torque of each of the MG 21a and the MG 21b according to the command from the HVECU 50, and to output the generated current signal to the PCU 24. The HVECU 50 can control the motors through the motor ECU 23.

The PCU 24 includes, for example, two inverters (not shown) provided to correspond to the MGs 21a, 21b, and a converter (not shown) arranged between each inverter and the drive battery 11. The PCU 24 is configured to supply power accumulated in the drive battery 11 to each of the MG 21a and the MG 21b, and to supply power generated by each of the MG 21a and the MG 21b to the drive battery 11. The PCU 24 is configured to be able to separately control the states of the MGs 21a, 21b, that is, for example, it can turn the MG 21b to a power running state while turning the MG 21a to a power generation state.

The MG 21a is configured to execute start processing of the engine 31. Specifically, when the engine 31 is started, the MG 21a that receives power supplied from the drive battery 11 executes cranking of the engine 31.

The MG 21a is configured to generate power (that is, engine power generation) using drive power output from the engine 31. The HVECU 50 charges the drive battery 11 with power generated by the engine power generation such that the SOC of the drive battery 11 does not become excessively low while the vehicle 100 is traveling. Further, the drive battery 11 is also charged with power generated by regenerative braking by the MG 21b.

The vehicle 100 is configured to execute HV traveling and EV traveling. The HV traveling is executed by the engine 31 and the MG 21b while the engine 31 is generating traveling driving power. The EV traveling is executed by the MG 21b when the engine 31 is in a stopped state. When the engine 31 is in the stopped state, combustion in each cylinder is not executed. When the combustion in each cylinder is stopped, combustion energy (and thus traveling driving power) is not generated in the engine 31.

The vehicle 100 further includes an auxiliary battery 80, DC/DC converters 81, 82, an auxiliary relay 83, a high voltage load 91, and a low voltage load 92. The full charge capacity of the auxiliary battery 80 is smaller than that of the drive battery 11. A full charge capacity of a battery is an electricity amount accumulated in the battery in a fully charged state and decreases as the battery deteriorates. As the auxiliary battery 80, for example, a lead battery can be employed. However, as the auxiliary battery 80, a secondary battery (for example, a nickel-hydrogen battery) other than the lead battery may be employed. The DC/DC converters 81, 82, the auxiliary relay 83, the high voltage load 91, and the low voltage load 92 are controlled by the HVECU 50. The HVECU 50 may control these through the battery ECU 13.

The high voltage load 91 is an auxiliary machine of a high voltage system. The low voltage load 92 is an auxiliary machine of a low voltage system. A drive voltage of the low voltage load 92 is lower than a drive voltage of the high voltage load 91. The auxiliary battery 80 is an in-vehicle battery of the low voltage system (for example, a 12 V system), and is configured to supply power to the low voltage load 92. In this embodiment, the high voltage load 91 includes air conditioning equipment and the low voltage load 92 includes a lighting device. The air conditioning equipment is configured to heat and cool a cabin of the vehicle 100. The lighting device includes a lighting device that illuminates the inside of the vehicle and a lighting device (for example, a headlight) that illuminates the outside of the vehicle. At least one of the high voltage load 91 and the low voltage load 92 may further include a seat heater that heats a seat of the vehicle 100.

The DC/DC converter 81 is provided between the drive battery 11 and the high voltage load 91, steps down power supplied from the drive battery 11 and outputs it to the high voltage load 91. The DC/DC converter 82 steps down power supplied from the drive battery 11 and outputs it to each of the auxiliary battery 80 and the low voltage load 92. When the SMR 14 is in the open state (the disconnected state), power of the drive battery 11 is not supplied to any of the high voltage load 91, the low voltage load 92, and the auxiliary battery 80. An auxiliary relay 83 is arranged in a current path that connects the DC/DC converter 82 to the low voltage load 92. When the auxiliary relay 83 is in the open state (the disconnected state), power is not supplied to the low voltage load 92.

When the SMR 14 is in the closed state (the connected state), power can be supplied from the drive battery 11 to the auxiliary battery 80 through the DC/DC converter 82. For example, when the SOC of the auxiliary battery 80 is lower than a predetermined value, the HVECU 50 charges the auxiliary battery 80 with power of the drive battery 11. Further, the HVECU 50 drives the high voltage load 91 and the low voltage load 92 using power of the drive battery 11 according to an instruction from a service tool 200 (see FIG. 2) in the deterioration diagnosis (see S16 of FIG. 3) of the assembled battery described below. At this time, the HVECU 50 controls the SMR 14, the DC/DC converters 81, 82, and the auxiliary relay 83 such that power of the drive battery 11 is supplied to each of the high voltage load 91 and the low voltage load 92.

The HVECU 50 is configured to execute an SOC limit control to the drive battery 11. The SOC limit control is a control for limiting the SOC of the drive battery 11 to within a predetermined SOC range. The HVECU 50 limits an input/output of the drive battery 11 such that the SOC of the drive battery 11 does not leave the SOC range. Specifically, the HVECU 50 controls the MGs 21a, 21b, the engine 31, and the DC/DC converters 81, 82 such that the SOC of the drive battery 11 is within the SOC range. The SOC range is variably set depending on a state of the vehicle 100. The HVECU 50 may set an SOC range for protecting the drive battery 11 and its peripheral parts using, for example, a map stored in the storage device 53.

The vehicle 100 further includes a power switch 103. The power switch 103 is used for switching between start/stop of a vehicle system (the HVECU 50 and the like). The power switch 103 is operated by the user.

The vehicle 100 further includes a notification device 104. The notification device 104 is configured to send a notification to the user of the vehicle 100 in response to a request from the HVECU 50. Examples of the notification device 104 can include a meter panel, a head-up display, a navigation display, a warning light, or a speaker. The notification device 104 may function as an input device that receives an input from the user. The notification device 104 may include a touch panel display or a smart speaker that receives a voice input. The notification device 104 may be mounted on a portable device (that is, an electronic device that can be carried by the user), such as a tablet terminal, a smartphone, or a wearable device.

Figure 2:
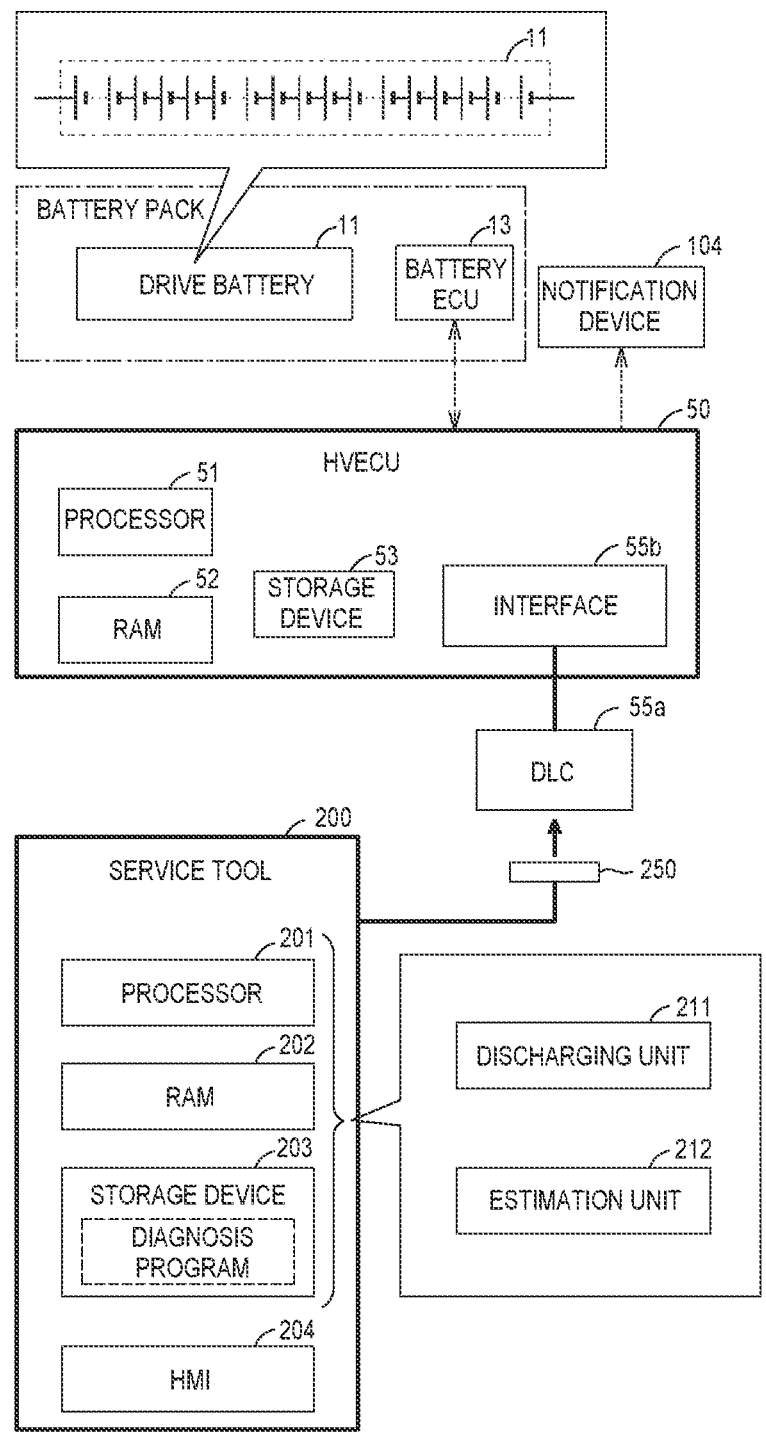
FIG. 2 is a diagram illustrating a configuration of a deterioration diagnosis apparatus of an assembled battery according to the embodiment of the present disclosure.

FIG. 2 is a diagram illustrating a configuration of a deterioration diagnosis apparatus of an assembled battery according to this embodiment. With reference to FIG. 2 together with FIG. 1, in this embodiment, the service tool 200 functions as a deterioration diagnosis apparatus of an assembled battery. The service tool 200 includes a computer including a processor 201, a RAM 202, and a storage device 203. The storage device 203 stores a diagnosis program. A deterioration diagnosis method (see FIGS. 3, 8, and 9 described below) of an assembled battery according to this embodiment is executed when the processor 201 executes the diagnosis program stored in the storage device 203.

The service tool 200 further includes a human machine interface (HMI) 204. The HMI 204 includes an input device and a display device. The HMI 204 may be a touch panel display. The HMI 204 may include a smart speaker that receives a voice input.

The HVECU 50 further includes a data link connector (DLC) 55a and an interface 55b of the DLC 55a. The DLC 55a is a connector that can be connected to a connector 250 of the service tool 200, and is arranged in, for example, the vicinity of a driver seat of the vehicle 100. The service tool 200 is an external diagnosis machine used by, for example, a worker (such as a mechanic) in a maintenance shop to grasp a state of a vehicle. Examples of the service tool 200 can include a general scan tool (GST). By connecting the connector 250 of the service tool 200 to the DLC 55a, the service tool 200 can read vehicle data stored in the storage device 53.

In the deterioration diagnosis method of the assembled battery according to this embodiment, the service tool 200 discharges each cell included in the drive battery 11 (the assembled battery) while measuring a voltage of each cell. The service tool 200 ends the discharging when the first end condition is satisfied. The first end condition is satisfied when the voltages of all the cells included in the drive battery 11 have reached a predetermined discharging end voltage (hereinafter, referred to as "$V_{end1}$"). After the end of the discharging, the service tool 200 estimates the deterioration degree of the drive battery 11 using voltage data indicating a transition of a voltage of at least one cell included in the drive battery 11 from the discharging start voltage to $V_{end1}$.

However, when a discharging end timing is decided only by the first end condition, the discharging of the drive battery 11 may be continued even when the drive battery 11 becomes unable to supply power required for the start processing of the engine 31 to the MG 21a. In such a diagnosis method, it may take time and effort to charge the drive battery 11 with an external power source (a power source outside the vehicle) after the end of the diagnosis.

Therefore, in the deterioration diagnosis method of the assembled battery according to this embodiment, the discharging is ended not only when the first end condition is satisfied but also when the second or third end condition described below is satisfied. In more detail, the service tool 200 determines, during the discharging of the drive battery 11, whether the drive battery 11 becomes unable to supply the power required for the start processing of the engine 31 to the MG 21a when the discharging is continued. Then, when it is determined that the drive battery 11 becomes unable to supply the power required for the start processing of the engine 31 to the MG 21a when the discharging is continued, the second end condition is satisfied. Then, the service tool 200 ends the discharging when the second end condition is satisfied. As such, the discharging of the drive battery 11 is ended before the drive battery 11 becomes unable to supply the power required for the start processing of the engine 31 to the MG 21a. For this reason, the MG 21a can receive power supplied from the drive battery 11 after the end of the discharging and execute the start processing of the engine 31. With the deterioration diagnosis method of the assembled battery according to this embodiment, it is possible to easily execute the start processing of the engine 31 after the discharging for the deterioration diagnosis of the drive battery 11 is executed.

The service tool 200 according to this embodiment includes a discharging unit 211 and an estimation unit 212. The discharging unit 211 is configured to discharge each cell while measuring the voltage of each cell included in the drive battery 11 mounted on the vehicle 100. The estimation unit 212 is configured to estimate the deterioration degree of the drive battery 11 using the acquired voltage data indicating the transition of the voltage of at least one cell included in the drive battery 11 from the discharging start voltage to $V_{end1}$. The discharging unit 211 is configured to determine, during the discharging of each cell included in the drive battery 11, whether the drive battery 11 becomes unable to supply the power required for the start processing of the engine 31 to the MG 21a when the discharging is continued, and to end the discharging before the drive battery 11 becomes unable to supply the power required for the start processing of the engine 31 to the MG 21a.

Figure 3:
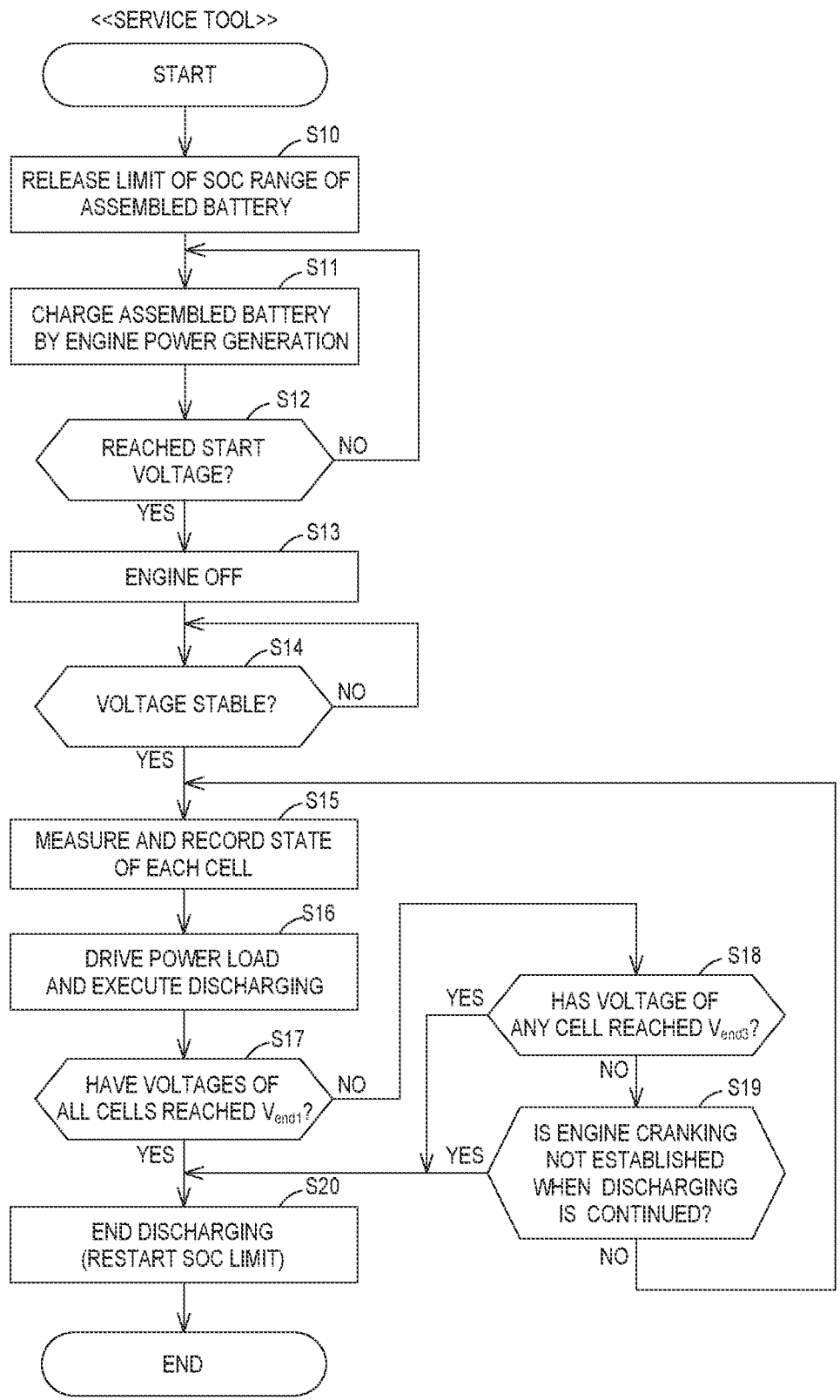
FIG. 3 is a flowchart illustrating a discharging control in a deterioration diagnosis method of the assembled battery according to the embodiment of the present disclosure.

FIG. 3 is a flowchart illustrating discharging control in the deterioration diagnosis method of the assembled battery according to this embodiment. Processes illustrated in this flowchart are executed when, for example, a predetermined instruction is input from the user to the HMI 204 after the connector 250 of the service tool 200 is connected to the DLC 55a of the vehicle 100 in a parked state. However, a condition of starting the process illustrated in FIG. 3 is not limited thereto, and can be arbitrarily set. The discharging unit 211 of the service tool 200 transmits a control command to the HVECU 50, whereby each step of FIG. 3 is executed. Hereinafter, each step in the flowchart is simply referred to as "S".

With reference to FIG. 3 together with FIGS. 1 and 2, in S10, the service tool 200 releases the SOC range regarding the SOC limit control. As such, the SOC limit (the SOC limit control) of the drive battery 11 becomes invalid.

Subsequently in S11, the service tool 200 drives the engine 31 and charges the drive battery 11 with power generated by the engine power generation. By the process of S11, power generated by the MG 21a using drive power output from the engine 31 is input to the drive battery 11 via the PCU 24 and the SMR 14.

In S12, the service tool 200 determines whether the voltages of all the cells included in the drive battery 11 have become a predetermined start voltage (hereinafter, referred to as "$V_{start}$") or higher. The voltage of each cell included in the drive battery 11 is measured by the voltage sensor 12a. $V_{start}$ may be a cell voltage indicating that the cell has turned to the fully charged state, or may be a charging upper limit voltage of the cell. The charging upper limit voltage corresponds to an upper limit value of a recommended voltage range. When the charging of the cell is continued until the voltage exceeds the charging upper limit voltage, the cell may be over-charged. The over-charging accelerates the deterioration of the cell. $V_{start}$ may be 3.6 V or higher and 3.9 V or lower, or may be approximately 3.6 V. Further, the service tool 200 may determine whether the voltages of all the cells included in the drive battery 11 have become $V_{start}$ or higher based on the SOC of the drive battery 11. For example, when the SOC of the drive battery 11 has become a predetermined SOC value (for example, 70%) or higher, the service tool 200 may determine that the voltages of all the cells included in the drive battery 11 have become $V_{start}$ or higher.

The processes of S11 and S12 are repeated until the voltages of all the cells included in the drive battery 11 become $V_{start}$ or higher (NO in S12). When the voltages of all the cells become $V_{start}$ or higher (YES in S12), in S13, the service tool 200 stops the engine 31. Thereafter, in S14, the service tool 200 determines whether the voltages of all the cells included in the drive battery 11 have become stable. The process stands by in S14 until the voltage of each cell included in the drive battery 11 becomes stable, and, when the voltage of each cell included in the drive battery 11 becomes stable (YES in S14), the process proceeds to S15.

In S15, the service tool 200 measures a state (a voltage, current, and a temperature) of each cell included in the drive battery 11, and records a measurement result in the storage device 203. Subsequently in S16, the service tool 200 discharges the drive battery 11 by controlling a power load of the vehicle 100. The drive battery 11 is configured to supply power to the power load mounted on the vehicle 100.

Specifically, in S16, the service tool 200 controls the power load (for example, at least one of the high voltage load 91 and the low voltage load 92) of the vehicle 100 such that discharging current of each cell included in the drive battery 11 becomes a predetermined value (hereinafter, referred to as "Vd"). In this embodiment, the air conditioning equipment (the high voltage load 91) and the lighting device (the low voltage load 92) are driven by power supplied from the drive battery 11. The service tool 200 adjusts power supplied from the drive battery 11 to the high voltage load 91 and the low voltage load 92, using the DC/DC converters 81, 82, respectively. Then, the service tool 200 maintains a current value during the discharging of each cell included in the drive battery 11. Vd may be 1 A or higher and 10 A or lower, or may be approximately 5 A. In this embodiment, the current value during the discharging of each cell is maintained at Vd. In this embodiment, Vd is set to a fixed value (for example, 5 A), but Vd may be variable depending on the situation.

In S17, the service tool 200 determines whether the first end condition is satisfied. Specifically, the service tool 200 determines whether the voltages of all the cells included in the drive battery 11 have reached the predetermined discharging end voltage ($V_{end1}$).

Figure 4:
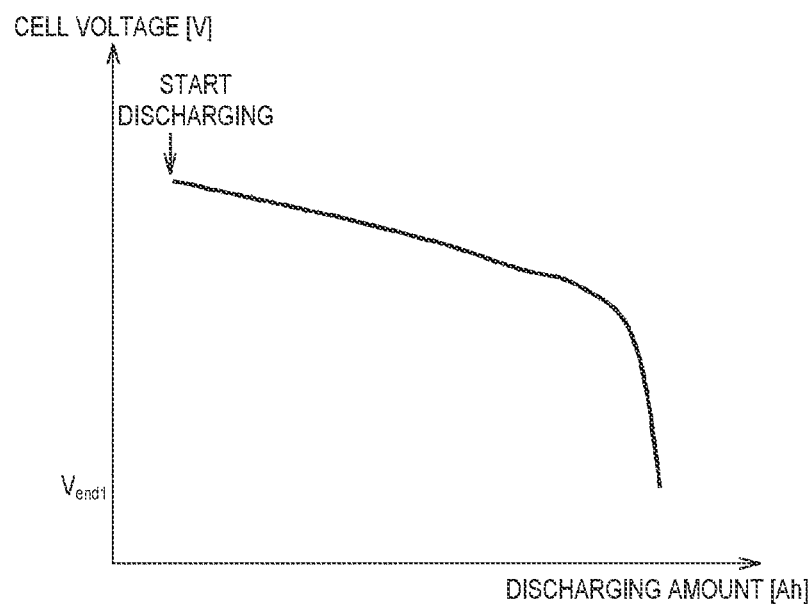
FIG. 4 is a graph illustrating an example of discharging characteristics of cells included in the assembled battery illustrated in FIG. 2.

FIG. 4 is a graph illustrating an example of discharging characteristics of the cells included in the drive battery 11. With reference to FIG. 4, when the discharging of the cell is started, the cell voltage gradually decreases. A decrease amount of a cell voltage per unit discharging amount (corresponding to a slope of the graph) is substantially constant immediately after the start of the discharging, but increases for a while when the discharging is continued. Then, when the discharging is further continued, the cell voltage reaches $V_{end1}$. FIG. 4 illustrates the transition of the voltage of one cell, but the transition of the voltage during the discharging is different for each cell.

With reference to FIG. 3 together with FIGS. 1 and 2 again, when a voltage of any cell included in the drive battery 11 does not reach $V_{end1}$ (NO in S17), the process proceeds to S18. In S18, the service tool 200 determines whether the third end condition is satisfied. The third end condition is satisfied when a voltage of any cell included in the drive battery 11 has reached a predetermined first stop voltage (hereinafter, referred to as "$V_{end3}$").

Figure 5:
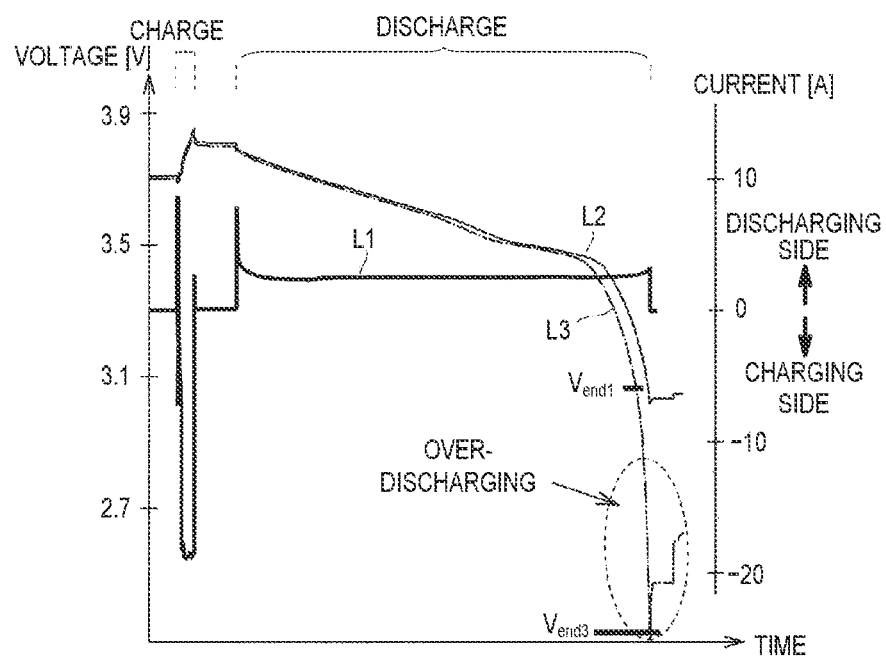
FIG. 5 is a graph for describing a method of deciding a discharging end voltage and a first stop voltage in the deterioration diagnosis method of the assembled battery according to the embodiment of the present disclosure.

FIG. 5 is a graph for describing a method of deciding the discharging end voltage ($V_{end1}$) and the first stop voltage ($V_{end3}$) in the deterioration diagnosis method of the assembled battery according to this embodiment. Lines L1 to L3 in FIG. 5 respectively illustrate examples of a transition of current and voltages of the drive battery 11 (the assembled battery) when S10 to S16 of FIG. 3 are executed, and the discharging (S16) is continued for a predetermined time. The line L1 illustrates a transition of current of the drive battery 11. Lines L2 and L3 respectively illustrate the discharging characteristics (more specifically, the transitions of the cell voltages during the discharging) of a first cell and a second cell included in the drive battery 11. A full charge capacity of the first cell is larger than that of the second cell.

With reference to FIG. 5, in a comparison between the transition of a voltage of the first cell (the line L2) and the transition of a voltage of the second cell (the line L3), the voltage of the second cell starts to decrease earlier than that of the first cell and decreases to a voltage lower than a voltage to which the voltage of the first cell decreases. As such, the cell voltage tends to easily decrease during the discharging as a full charge capacity is smaller. When the voltage of the cell decreases too much due to the discharging of the cell, the deterioration of the cell is accelerated. The fact that the discharging of the voltage of the cell is continued until it decreases too much is referred to as the "over-discharging".

In the deterioration diagnosis method of the assembled battery according to this embodiment, $V_{end1}$ is set such that the over-discharging of the cell is restricted. Specifically, $V_{end1}$ is set based on a discharging lower limit voltage common to all the cells included in the drive battery 11. The discharging lower limit voltage corresponds to a lower limit value of the recommended voltage range. When the discharging of a cell is continued until its voltage falls below the discharging lower limit voltage, the cell may be over-discharged. In this embodiment, $V_{end1}$ is set to a voltage slightly higher than the discharging lower limit voltage (for example, a value obtained by adding an extra voltage to the discharging lower limit voltage). $V_{end1}$ may be 2.8 V or higher and 3.2 V or lower. In this embodiment, $V_{end1}$ is set to 3.0 V. Then, in the processes illustrated in FIG. 3, when the voltages of all the cells included in the drive battery 11 reach $V_{end1}$ (YES in S17), the discharging of the drive battery 11 is ended (see S20 described below).

When the discharging of the cell is excessively continued after the cell voltage has become lower than the discharging lower limit voltage, an abnormality (for example, malfunction or failure) may occur in the cell. In the deterioration diagnosis method of the assembled battery according to this embodiment, $V_{end3}$ is set such that an abnormality does not occur in the cell. Specifically, $V_{end3}$ is set based on a discharging prohibition voltage common to all the cells included in the drive battery 11. The discharging prohibition voltage corresponds to a dischargeable limit value, and when the discharging of the cell is continued until its voltage falls below the discharging prohibition voltage, an abnormality may occur in the cell. In this embodiment, $V_{end3}$ is set to a voltage slightly higher than the discharging prohibition voltage (for example, a value obtained by adding an extra voltage to the discharging prohibition voltage). $V_{end3}$ is a value lower than $V_{end1}$. $V_{end3}$ may be 2.0 V or higher and 2.5 V or lower. In this embodiment, $V_{end3}$ is set to 2.3 V. Then, in the processes illustrated in FIG. 3, when a voltage of any cell included in the drive battery 11 reaches $V_{end3}$ (YES in S18), the discharging of the drive battery 11 is ended (see S20 described below).

With reference to FIG. 3 together with FIGS. 1 and 2 again, when a voltage of any cell included in the drive battery 11 has not reached $V_{end3}$ (NO in S18), the process proceeds to S19. In S19, the service tool 200 determines whether the second end condition is satisfied. Specifically, the service tool 200 determines whether engine cranking is not established when the discharging is continued (that is, whether the drive battery 11 becomes unable to supply the power required for the start processing of the engine 31 to the MG 21a when the discharging is continued). In this embodiment, at a time at which the average value (hereinafter, also referred to as the "average cell voltage") of the voltages of all the cells included in the drive battery 11 (the assembled battery) has become a predetermined second stop voltage (hereinafter, referred to as "$V_{end2}$") or lower, it is determined that the drive battery 11 becomes unable to supply the power required for the start processing of the engine 31 to the MG 21a when the discharging is continued after the time. Hereinafter, with reference to FIGS. 6 and 7, a method of deciding the second stop voltage ($V_{end2}$) in the deterioration diagnosis method of the assembled battery according to this embodiment will be described.

Figure 6:
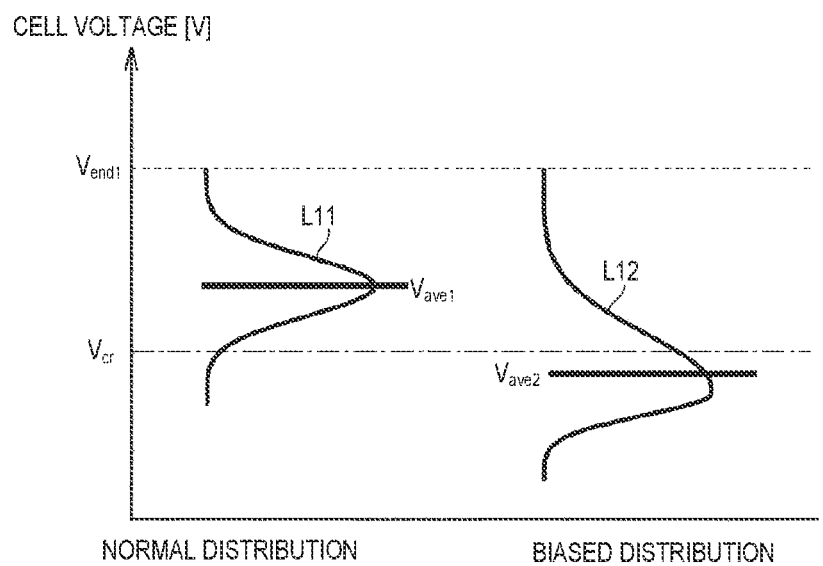
FIG. 6 is a first graph for describing a method of deciding a second stop voltage in the deterioration diagnosis method of the assembled battery according to the embodiment of the present disclosure.

FIG. 6 illustrates a first graph for describing the method of deciding the second stop voltage ($V_{end2}$). A line L11 in FIG. 6 illustrates a voltage distribution (hereinafter, referred to as a "first cell voltage distribution") of all the cells included in a first assembled battery. A line L12 in FIG. 6 illustrates a voltage distribution (hereinafter, referred to as a "second cell voltage distribution") of all the cells included in a second assembled battery. In FIG. 6, $V_{ave1}$ and $V_{ave2}$ represent the average cell voltages of the first assembled battery and the second assembled battery, respectively. $V_{cr}$ represents a lower limit voltage for cranking establishment. In each assembled battery, when the average cell voltage falls below $V_{cr}$, the cranking is not established.

The first cell voltage distribution (the line L11) and the second cell voltage distribution (the line L12) illustrated in FIG. 6 are distributions when the discharging is continued until the first end condition is satisfied for the first assembled battery and the second assembled battery, respectively. In other words, voltages of all the cells included in each of the first and second assembled batteries have become $V_{end1}$ or lower.

With reference to FIG. 6, the first cell voltage distribution corresponds to a normal distribution (general variations). The average cell voltage ($V_{ave1}$) of the first assembled battery is higher than $V_{cr}$. For this reason, the first assembled battery can supply power required for the cranking. On the other hand, in the second cell voltage distribution, the cell voltages are biased toward the low voltage side. The average cell voltage ($V_{ave2}$) of the second assembled battery is lower than $V_{cr}$. For this reason, the second assembled battery becomes unable to supply power required for the cranking.

Figure 7:
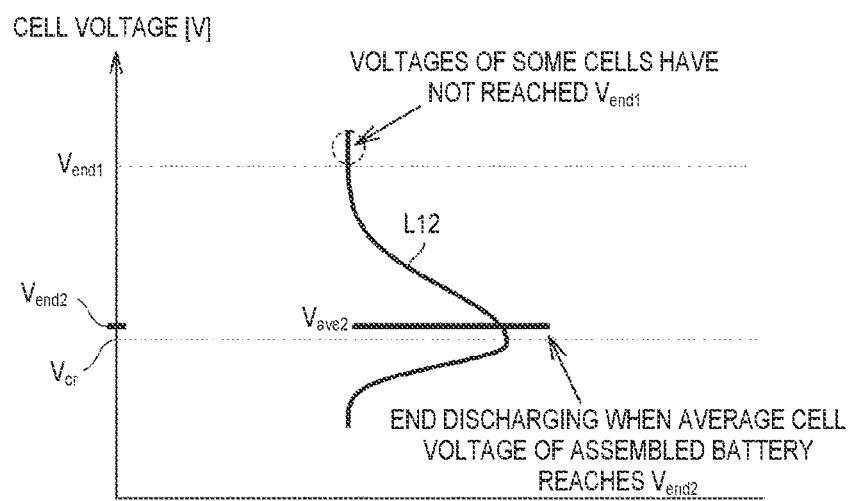
FIG. 7 is a second graph for describing the method of deciding the second stop voltage in the deterioration diagnosis method of the assembled battery according to the embodiment of the present disclosure.

FIG. 7 illustrates a second graph for describing the method of deciding the second stop voltage ($V_{end2}$). The second cell voltage distribution (a line L12) illustrated in FIG. 7 is the distribution when the discharging of the second assembled battery is ended at a timing at which the second end condition is satisfied. In other words, the average cell voltage ($V_{ave2}$) of the second assembled battery matches the second stop voltage ($V_{end2}$). In this embodiment, $V_{end2}$ is set to a voltage (for example, a value obtained by adding an extra voltage to $V_{cr}$) slightly higher than $V_{cr}$. $V_{cr}$ is a voltage value required for the MG 21*a* to execute the start processing of the engine 31.

In the processes illustrated in FIG. 3, at a time at which the average cell voltage of the drive battery 11 becomes $V_{end2}$ or lower (YES in S19), the discharging of the drive battery 11 is ended (see S20 described below). When the determination is positive in S19, it means that the drive battery 11 becomes unable to supply the power required for the start processing of the engine 31 to the MG 21*a* when the discharging is continued after the time. When the second end condition is satisfied before the first end condition is satisfied, and the discharging is ended, voltages of some cells included in the drive battery 11 (the assembled battery) do not reach $V_{end1}$ (see FIG. 7). However, since these cells are considered to have a sufficiently large capacity, it is considered that there is no significant influence on the accuracy of determination (see FIGS. 8 to 10) of the life of the assembled battery described below. In this embodiment, $V_{end2}$ is set to the average cell voltage (the average value of the voltages of all the cells included in the assembled battery), but the median value may be employed instead of the average value. $V_{end2}$ may be set to the median value of the voltages of all the cells included in the assembled battery.

With reference to FIG. 3 together with FIGS. 1 and 2 again, while none of the first to third end conditions are satisfied (NO in all of S17 to S19), the processes of S15 to S19 are repeated, and the discharging of the drive battery 11 is continued. Then, when any of the first to third end conditions is satisfied (YES in any of S17 to S19), in S20, the service tool 200 ends the discharging of the drive battery 11.

After ending the discharging of the drive battery 11 in S20, the service tool 200 restarts the SOC limit control. As such, the SOC of the drive battery 11 is limited to within the predetermined SOC range, again. Then, when the process of S20 is executed, a series of processes illustrated in FIG. 3 ends.

By the above-described processes illustrated in FIG. 3, the data indicating a state (particularly, the deterioration degree) of the drive battery 11 is recorded in the storage device 203 of the service tool 200. The service tool 200 estimates the deterioration degree of the drive battery 11 using the recorded data of the drive battery 11. Then, the service tool 200 determines whether a life of the drive battery 11 has run out (that is, whether the use of drive battery 11 can be continued).

Figure 8:
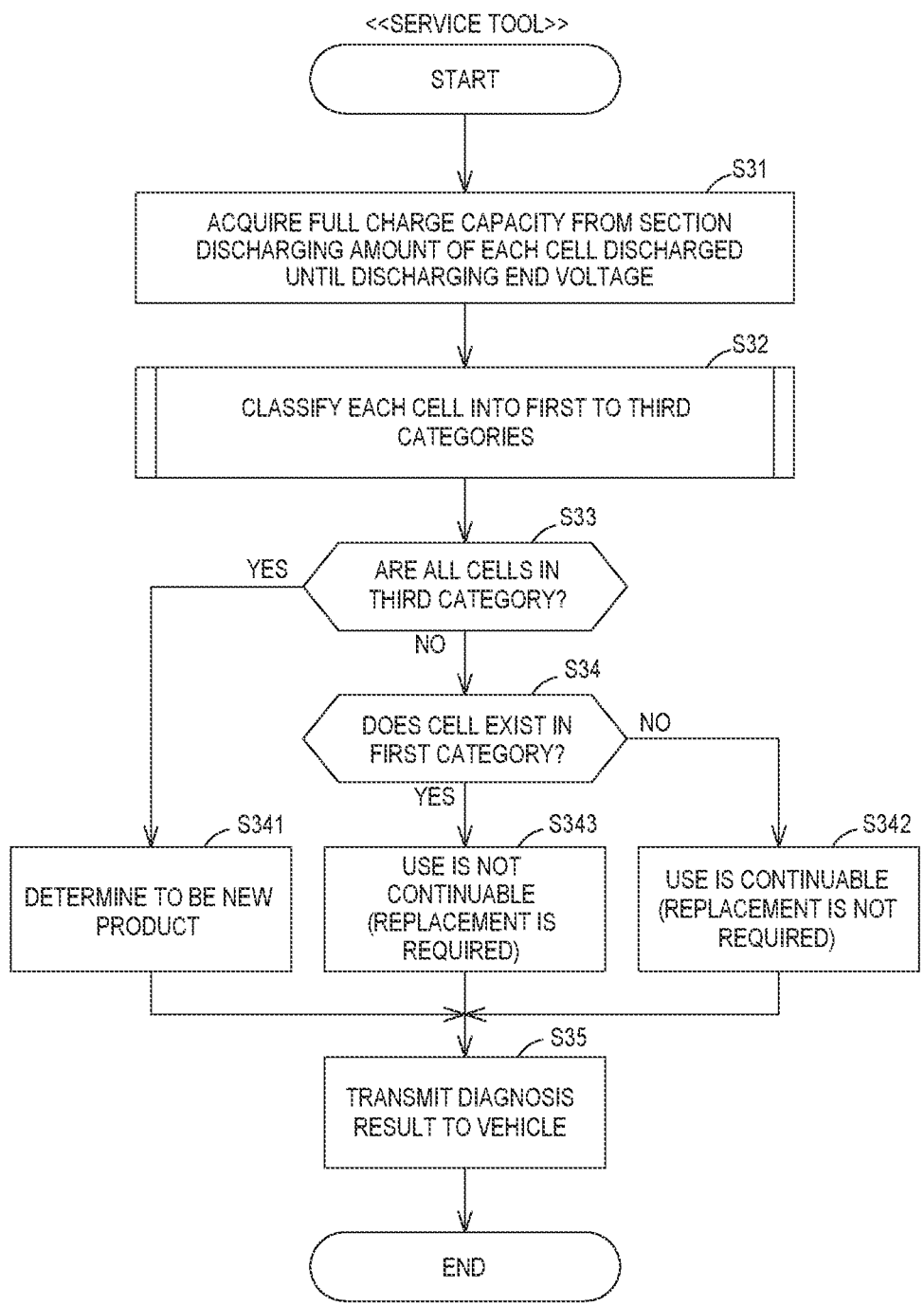
FIG. 8 is a flowchart illustrating processes executed by a service tool after execution of processes illustrated in FIG. 3.

FIG. 8 is a flowchart illustrating processes executed by the service tool 200 after the execution of the processes illustrated in FIG. 3. The processes illustrated in this flowchart are executed when a predetermined instruction is input from the user to the HMI 204 after the service tool 200 acquires the data of the drive battery 11 by, for example, the processes illustrated in FIG. 3. However, a condition for starting the process illustrated in FIG. 8 is not limited thereto and can be arbitrarily set. For example, the process illustrated in FIG. 8 may be automatically started after the process illustrated in FIG. 3 ends. Each step illustrated in FIG. 8 is executed by the estimation unit 212 of the service tool 200. In this embodiment, the processes illustrated in FIG. 8 described below are executed in a state where the vehicle 100 and the service tool 200 are connected to each other.

With reference to FIG. 8 together with FIGS. 1 and 2, in S31, the service tool 200 estimates the full charge capacity of each cell of which a voltage has reached $V_{end1}$ due to the above-described discharging (S16 of FIG. 3) from among all the cells included in the drive battery 11. When the discharging is ended by the satisfaction of the first end condition (YES in S17 of FIG. 3), the full charge capacities of all the cells included in the drive battery 11 are estimated. When the discharging is ended by the satisfaction of the second or third end condition (YES in S18 or S19 of FIG. 3), a full charge capacity of only a cell of which a voltage has reached $V_{end1}$ before the end of the discharging is estimated.

Specifically, the service tool 200 acquires a section discharging amount (Ah) from the discharging start voltage to $V_{end1}$ (the discharging end voltage) of each cell using the data (including the voltage data indicating the transition of the cell voltage from the discharging start voltage to the discharging end voltage) acquired in S15 of FIG. 3. The discharging amount corresponds to a time integral value of a discharging current (A). When the discharging current fluctuates within a section, the section discharging amount can be obtained by integrating the discharging current for each unit time with respect to time. When the discharging current is constant within the section, a value obtained by multiplying the discharging current (A) by a discharging period (h) corresponds to the discharging amount.

As above, the service tool 200 calculates the section discharging amount (that is, the section discharging amount from the discharging start voltage to $V_{end1}$) of the cell and converts the section discharging amount into the full charge capacity using a predetermined map. A map illustrating a relationship between a temperature of the cell, the section discharging amount, and the full charge capacity may be used to obtain the full charge capacity of the cell. When the temperature of the cell and the section discharging amount are given to the map, the full charge capacity of the cell is output from the map. The temperature of the cell that is used may be the average temperature during the discharging or the temperature at the start of the discharging. The map may be stored in the storage device 203 in advance. The service tool 200 may acquire the map from an external server (for example, a server that manages information on various batteries), or may acquire the map from the vehicle 100.

Subsequently in S32, the service tool 200 classifies a cell based on the full charge capacity (hereinafter, also referred to as a "cell estimation capacity") of the cell that is estimated in S31. A target of the classification is a cell of which a full charge capacity has been estimated in S31. The classification is executed for each cell. Specifically, the service tool 200 classifies the cell into any of the first to third categories based on the full charge capacity of the cell. The first to third categories are classified according to the size of the full charge capacity. The categories of the full charge capacities are in order of the first category, the second category, and the third category from the smallest. It is considered that the smaller the cell estimation capacity, the higher the deterioration degree. In this embodiment, the number of categories is three, but the number of categories can be appropriately changed. The number of categories may be 4 or higher and lower than 10, or may be 10 or higher.

Figure 9:
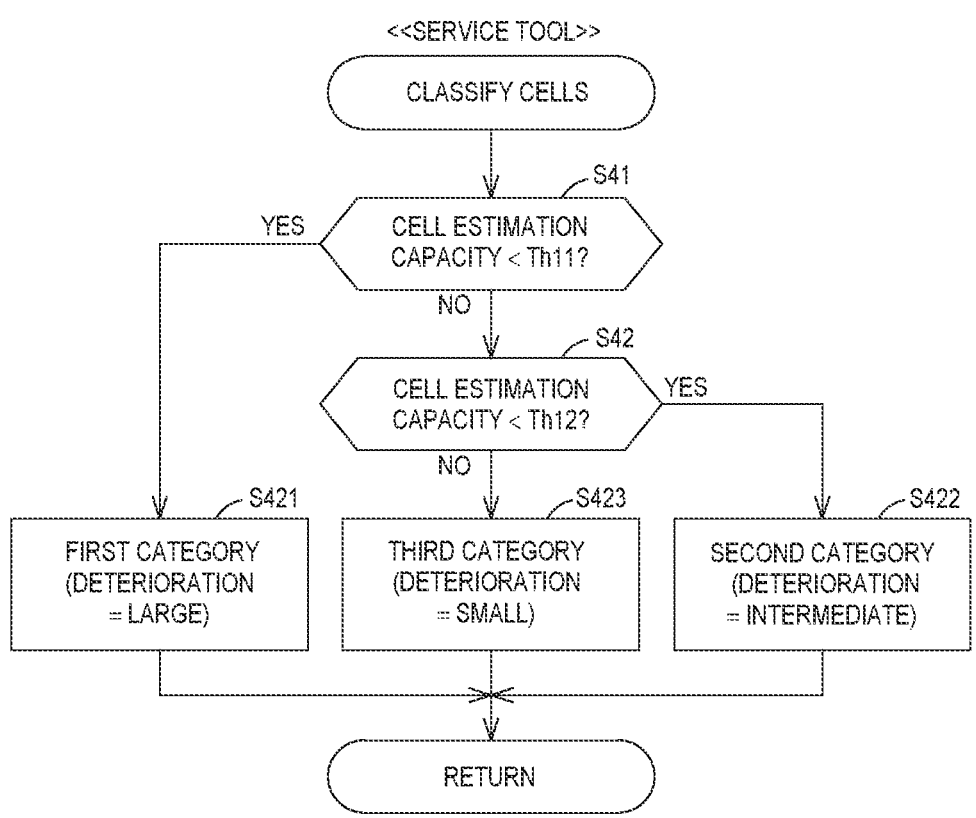
FIG. 9 is a flowchart illustrating details of the processes regarding cell classification illustrated in FIG. 8.

FIG. 9 is a flowchart illustrating details of S32. With reference to FIG. 9, in S41, the service tool 200 determines whether the cell estimation capacity is smaller than a predetermined first threshold value (hereinafter, referred to as "Th11"). Further, in S42, the service tool 200 determines whether the cell estimation capacity is smaller than a predetermined second threshold value (hereinafter, referred to as "Th12"). Th12 is higher than Th11 (see FIG. 10 described below).

When the cell estimation capacity is lower than Th11 (YES in S41), in S421, the cell is classified into the first category. When the cell estimation capacity is Th11 or higher and lower than Th12 (NO in S41 and YES in S42), in S422, the cell is classified into the second category. When the cell estimation capacity is Th12 or higher (NO in both S41 and S42), in S423, the cell is classified into the third category.

A series of processes illustrated in FIG. 9 is executed for each cell. When the processes illustrated in FIG. 9 are executed for each cell of which a full charge capacity has been estimated in S31 of FIG. 8, the process proceeds to S33 of FIG. 8. A cell (that is, a cell of which a voltage has reached the discharging end voltage before the end of the discharging) classified into any of the first to third categories by the processes illustrated in FIG. 9 is also referred to as a "diagnosis target cell" hereinbelow.

With reference to FIG. 8 with FIGS. 1 and 2 again, in S33, the service tool 200 determines whether all of the diagnosis target cells have been classified into the third category (S423 of FIG. 9). Further, in S34, the service tool 200 determines whether a cell that has been classified into the first category (S421 of FIG. 9) exists among the diagnosis target cells.

When all of the diagnosis target cells have been classified into the third category (YES in S33), in S341, the service tool 200 determines that the drive battery 11 is new. When a cell that has been classified into the first category exists among the diagnosis target cells (NO in S33 and YES in S34), in S343, the service tool 200 determines that use of the drive battery 11 is not continuable (that is, the use of the drive battery 11 in the vehicle 100 cannot be continued). When all the diagnosis target cells are not classified into the third category and no cell that has been classified into the first category exists among the diagnosis target cells (NO in both S33 and S34), in S342, the service tool 200 determines that the use of the drive battery 11 is continuable (that is, the use of the drive battery 11 in the vehicle 100 can be continued).

Figure 10:
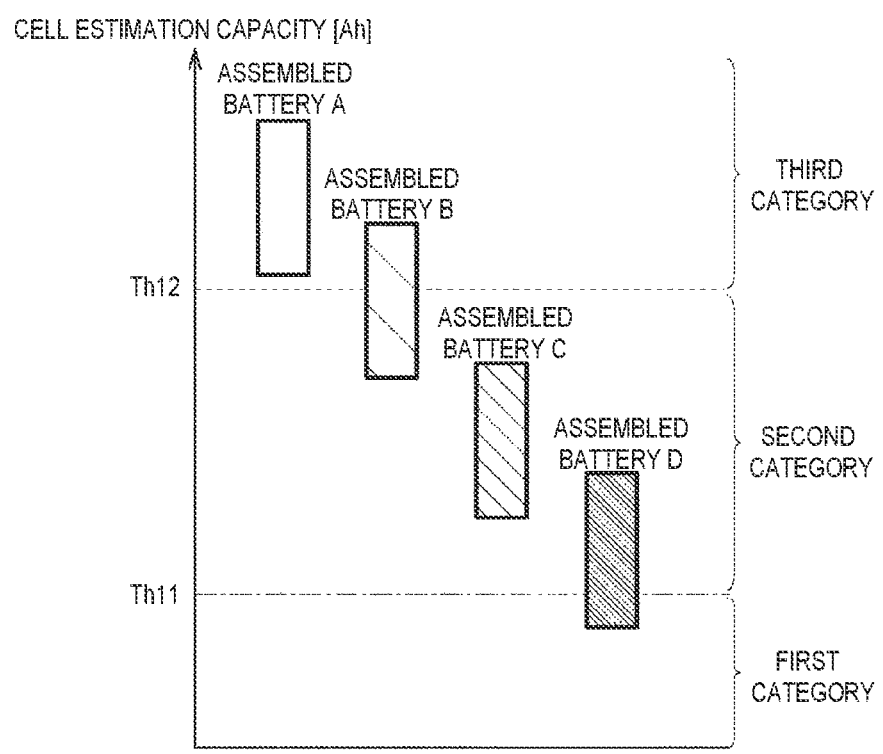
FIG. 10 is a diagram for describing a determination of a battery life in the deterioration diagnosis method of the assembled battery according to the embodiment of the present disclosure.

FIG. 10 is a diagram for describing the determination (S33, S34, and S341 to S343 of FIG. 8) of a battery life in the deterioration diagnosis method of the assembled battery according to the embodiment of the present disclosure.

With reference to FIG. 10, in the assembled battery A, all the diagnosis target cells have been classified into the third category. For this reason, a positive determination is made in S33 of FIG. 8, and the assembled battery A is determined to be "new" (S341). In each of the assembled batteries B and C, all the diagnosis target cells have not been classified into the third category, and no cell that has been classified into the first category exists among the diagnosis target cells. For this reason, negative determinations are made in both S33 and S34 of FIG. 8, and the use of each of the assembled batteries B and C is determined to be "continuable" (S342). In an assembled battery D, a cell that has been classified into the first category exists among the diagnosis target cells. For this reason, a negative determination is made in S33 of FIG. 8 and a positive determination is made in S34 of FIG. 8, and the use of the assembled battery D is determined to be "not continuable" (S343).

With reference to FIG. 8 together with FIGS. 1 and 2 again, when any of the processes of S341 to S343 is executed, the process proceeds to S35. In S35, the service tool 200 transmits, to the vehicle 100, diagnosis results (any of the state where the assembled battery is new/the state where the use of the assembled battery is continuable/the state where the use thereof is not continuable) of S341 to S343. The diagnosis result received by the vehicle 100 is stored in, for example, the storage device 53 of the HVECU 50. When the process of S35 is executed, a series of processes illustrated in FIG. 8 ends.

Figure 11:
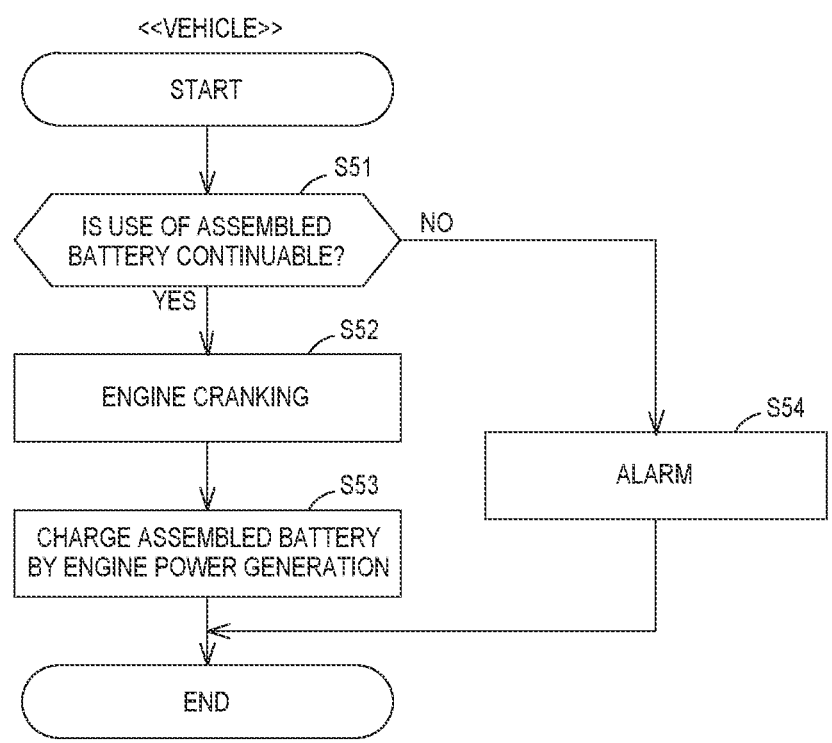
FIG. 11 is a flowchart illustrating processes executed by the vehicle after execution of the processes illustrated in FIG. 8.

FIG. 11 is a flowchart illustrating processes executed by the vehicle 100 after the execution of the processes illustrated in FIG. 8. The process illustrated in this flowchart is started when, for example, the service tool 200 is removed from the vehicle 100 after the processes illustrated in FIG. 8 ends. However, a condition of starting a process illustrated in FIG. 11 is not limited thereto, and can be arbitrarily set. For example, the HVECU 50 may start the process illustrated in FIG. 11 in response to a request from a user after the processes illustrated in FIG. 8 ends. Each step illustrated in FIG. 11 is executed by the HVECU 50.

With reference to FIG. 11 together with FIGS. 1 and 2, in S51, the HVECU 50 determines whether the use of the drive battery 11 in the vehicle 100 is continuable, using the deterioration degree of the drive battery 11, which has been estimated by the service tool 200. Specifically, when the state of the drive battery 11 corresponds to "the state where the drive battery 11 is new" or "the state where the use of the battery is continuable", the HVECU 50 determines that the use of the drive battery 11 in the vehicle 100 is continuable (YES in S51), and the process proceeds to S52. On the other hand, when the state of the drive battery 11 corresponds to the state where "the use is not continuable", the HVECU 50 determines that the use of the drive battery 11 in the vehicle 100 is not continuable (NO in S51), and the process proceeds to S54.

In S52, the HVECU 50 executes a start control of the engine 31. Specifically, the HVECU 50 controls the MG 21a, the MG 21b, and the engine 31 such that the engine 31 is started. The HVECU 50 controls the MG 21a and the MG 21b via the PCU24. In the start control of the engine 31, the MG 21a executes the cranking of the engine 31 using power supplied from the drive battery 11. The cranked engine 31 starts combustion. As such, the engine 31 is started.

Subsequently in S53, the HVECU 50 charges the drive battery 11 with power generated by the engine power generation. As such, power generated by the MG 21a using drive power output from the started engine 31 is input to the drive battery 11 via the PCU 24 and the SMR 14. When the SOC of the drive battery 11 becomes a predetermined value or higher, the HVECU 50 ends the charging. The HVECU 50 may return the SOC of the drive battery 11 to the SOC value before the diagnosis by the process of S53. Alternatively, the HVECU 50 may charge the drive battery 11 until the vehicle 100 turns to a state of being capable of EV traveling. When the process of S53 (the charging of the drive battery 11) is ended, a series of processes illustrated in FIG. 11 ends.

In S54, the HVECU 50 sends a notification indicating that the use of the drive battery 11 in the vehicle 100 is not continuable. The HVECU 50 may control the notification device 104 such that it prompts a replacement of the drive battery 11. For example, the notification device 104 may display a message indicating that a time to replace the drive battery 11 has arrived. However, the present disclosure is not limited thereto, and the notification device 104 may prompt the replacement of the drive battery 11 by sound (including voice). Alternatively, the HVECU 50 may send a predetermined notification (for example, a notification indicating that a replacement of the drive battery 11 is required) to a terminal (for example, a smartphone or a wearable device) carried by the user of the vehicle 100. When the process of S54 is executed, the series of processes illustrated in FIG. 11 ends.

After the process of S54, the drive battery 11 is replaced. In this embodiment, a battery pack including the drive battery 11 is replaced. However, the present disclosure is not limited thereto, and the assembled battery may be replaced (rebuilt) by a unit of a cell. The drive battery 11 removed from the vehicle 100 may be used for other purposes.

As described above, the deterioration diagnosis method of the assembled battery according to this embodiment includes the series of processes illustrated in FIG. 3, the series of processes illustrated in FIG. 8, and the series of processes illustrated in FIG. 11.

In the processes illustrated in FIG. 3, the service tool 200 discharges each cell while measuring the voltage of each cell included in the drive battery 11 (S15 and S16) in the vehicle 100 including the engine 31 (the internal combustion engine), the MG 21*a* (the motor that executes the start processing of the engine 31), and the drive battery 11 (the assembled battery) that supplies power to the MG 21*a*. The service tool 200 repeatedly determines, during the discharging of each cell, whether the drive battery 11 becomes unable to supply the power required for the start processing of the engine 31 to the MG 21*a* when the discharging is continued (S19). Upon determining, during the discharging of each cell, that the drive battery 11 becomes unable to supply the power required for the start processing of the engine 31 to the MG 21*a* when the discharging is continued (NO in S19), the service tool 200 ends the discharging (S20).

After the end of the discharging, the service tool 200 estimates the deterioration degree of the drive battery 11 by the processes illustrated in FIG. 8, using the voltage data, which is acquired during the discharging, of at least one cell. Specifically, the service tool 200 determines whether the state of the drive battery 11 corresponds to any of the state where the drive battery 11 is new (the deterioration degree is low), the state where the use of the battery is continuable (the deterioration degree is approximately intermediate), or the state where the use thereof is not continuable (the deterioration degree is high) (S341 to S343).

With reference to FIG. 11, the vehicle 100 determines whether the use of the drive battery 11 in the vehicle 100 is continuable, using the deterioration degree of the drive battery 11, which has been estimated by the service tool 200 (S51). When the vehicle 100 determines that the use of the drive battery 11 in the vehicle 100 is continuable (YES in S51), the MG 21*a* executes the start processing of the engine 31 (S52). Then, the vehicle 100 charges the drive battery 11 with power generated by using drive power output from the started engine 31 (S53).

With the deterioration diagnosis method of the assembled battery, it is possible to easily execute the start processing of the engine 31 (the internal combustion engine) after the discharging for the deterioration diagnosis of the drive battery 11 (the assembled battery) is executed. Further, it is also possible to easily charge the drive battery 11 that has been discharged for the deterioration diagnosis. In the above deterioration diagnosis method, the drive battery 11 is discharged while it is mounted on the vehicle 100. Since the full charge capacity of the drive battery 11 to be diagnosed is 5 kWh or smaller, it is possible to execute the diagnosis with sufficient throughput.

The processes illustrated in FIG. 3 may be appropriately changed. Further, the end condition of the discharging can also be appropriately changed. For example, the third end condition (S18 of FIG. 3) may be omitted if unnecessary. Alternatively, an additional end condition may be added to the first to third end conditions.

In the above embodiment, the discharging unit 211 and the estimation unit 212 in the service tool 200 are embodied by the processor 201 and a program executed by the processor 201. However, the present disclosure is not limited thereto, and the discharging unit 211 and the estimation unit 212 may be embodied by dedicated hardware (an electronic circuit).

Figure 12:
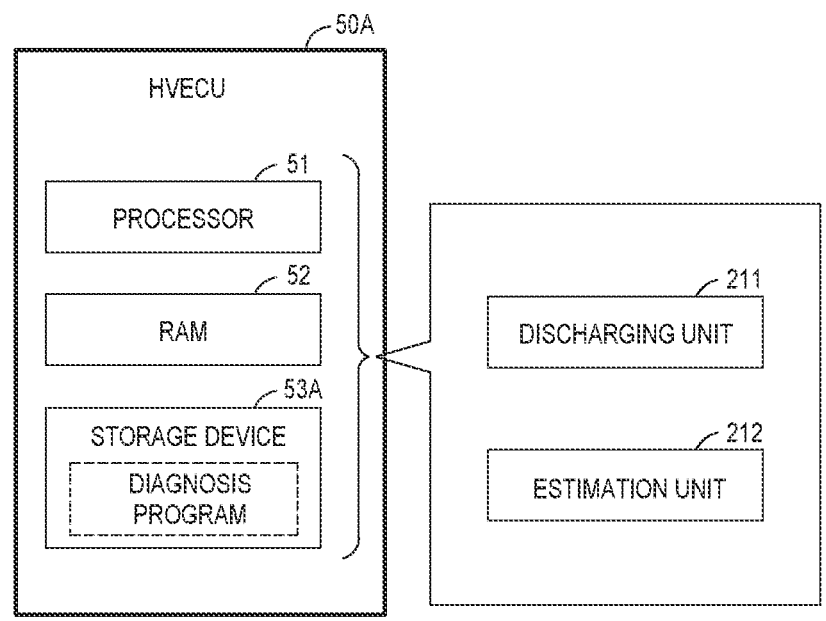
FIG. 12 is a diagram illustrating a modified example of an HVECU illustrated in FIG. 2.

Further, functions of the discharging unit 211 and the estimation unit 212 may be implemented in the vehicle 100. FIG. 12 is a diagram illustrating a modified example of the HVECU 50 illustrated in FIG. 2. With reference to FIG. 12, an HVECU 50A mounted on the vehicle 100 may include the discharging unit 211 and the estimation unit 212. The discharging unit 211 and the estimation unit 212 in the HVECU 50A may be embodied by the processor 51 and a program executed by the processor 51 (for example, a diagnosis program stored in a storage device 53A).

In the above embodiment, the assembled battery mounted on the HEV which does not include an inlet for a plug-in is a target of the deterioration diagnosis. However, the present disclosure is not limited thereto, and an assembled battery mounted on a plug-in hybrid electric vehicle (PHEV) which includes an inlet for a plug-in may be a target of the deterioration diagnosis.

Figure 13:
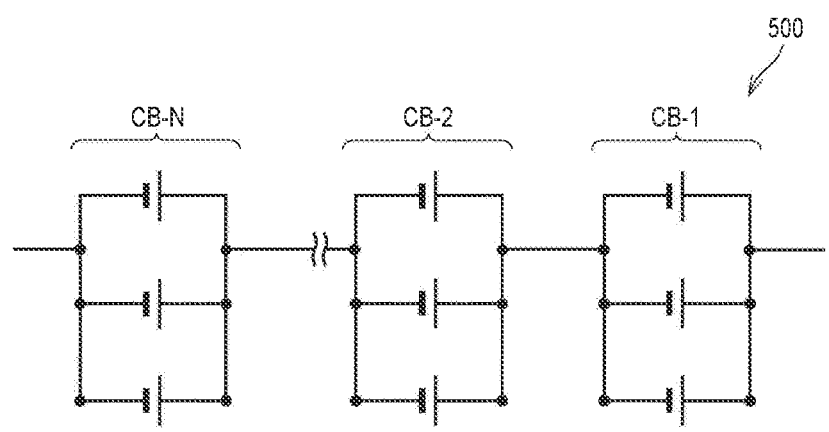
FIG. 13 is a diagram illustrating a modified example of the assembled battery illustrated in FIG. 2.

In some embodiments, not all of the cells are connected in series in the assembled battery of which the deterioration is diagnosed by any of the above-described methods (see FIG. 2). The structure of the assembled battery of which the deterioration is diagnosed is arbitrary. FIG. 13 is a diagram illustrating a modified example of the assembled battery illustrated in FIG. 2. For example, an assembled battery 500 illustrated in FIG. 13 may be a target of the deterioration diagnosis. The assembled battery 500 includes N parallel cell blocks (that is, parallel cell blocks CB-1 to CB-N). Each of the parallel cell blocks CB-1 to CB-N includes a plurality of cells connected in parallel. The number of cells connected in parallel in each parallel cell block is arbitrary, but in the example illustrated in FIG. 13, it is three. The parallel cell blocks CB-1 to CB-N are connected in series via a power line.

The embodiment disclosed herein needs to be considered as illustrative in all points and not restrictive. The scope of the present disclosure is shown not by the above description of the embodiments but by the claims, and is intended to include meanings equivalent to the claims and all modifications within the scope thereof.

What is claimed is:

1. A deterioration diagnosis apparatus of an assembled battery, the deterioration diagnosis apparatus comprising at least one processor configured to:
   execute discharging of each of a plurality of cells included in the assembled battery mounted on a vehicle while measuring a voltage of each of the cells; and
   estimate a deterioration degree of the assembled battery using voltage data indicating a transition of a voltage of at least one of the cells from a discharging start voltage to a predetermined discharging end voltage, wherein:

the vehicle includes an internal combustion engine and a motor that executes start processing of the internal combustion engine;

the assembled battery is configured to supply power to the motor;

the at least one processor is configured to determine, during the discharging of each of the cells, whether the assembled battery becomes unable to supply power required for the start processing to the motor when the discharging is continued, and end the discharging before the assembled battery becomes unable to supply the power required for the start processing to the motor; and the at least one processor is configured to:
end the discharging when any of a first end condition and a second end condition is satisfied, the first end condition being satisfied when voltages of all the cells included in the assembled battery reach the discharging end voltage, and the second end condition being satisfied when a determination is made that the assembled battery becomes unable to supply the power required for the start processing to the motor when the discharging is continued;

estimate, when the discharging is ended by the satisfaction of the first end condition, the deterioration degree of the assembled battery using voltage data of all the cells included in the assembled battery; and estimate, when the discharging is ended by the satisfaction of the second end condition, the deterioration degree of the assembled battery using voltage data of a cell of which a voltage reaches the discharging end voltage before the end of the discharging.

2. The deterioration diagnosis apparatus according to claim 1, wherein the at least one processor is configured to, during the discharging of each of the cells, at a time at which an average value or a median value of voltages of all the cells included in the assembled battery becomes a predetermined value or lower, determine that the assembled battery becomes unable to supply the power required for the start processing to the motor when the discharging is continued after the time, and end the discharging.

3. The deterioration diagnosis apparatus according to claim 1, wherein:
the at least one processor is configured to end the discharging even when a third end condition is satisfied;
the third end condition is satisfied when a voltage of any cell included in the assembled battery reaches a predetermined voltage; and
the predetermined voltage is lower than the discharging end voltage.

4. The deterioration diagnosis apparatus according to claim 1, wherein the at least one processor is configured to estimate a full charge capacity of each of the cells using the voltage data, and classify each of the cells based on the estimated full charge capacity.

5. The deterioration diagnosis apparatus according to claim 4, wherein:
the at least one processor is configured to, based on the estimated full charge capacity, classify the cells into any of a first category, a second category having a larger full charge capacity than the first category, and a third category having a larger full charge capacity than the second category;

the at least one processor is configured to:
determine that the assembled battery is new when all the cells of which the voltages reach the discharging end voltage before the end of the discharging are classified into the third category; and
determine that use of the assembled battery in the vehicle is not continuable when at least one of the cells of which the voltages reach the discharging end voltage before the end of the discharging is classified into the first category.

6. The deterioration diagnosis apparatus according to claim 1, wherein:
the assembled battery is configured to supply power to a power load mounted on the vehicle; and
the at least one processor is configured to execute the discharging by controlling the power load.

7. The deterioration diagnosis apparatus according to claim 1, wherein:
all the cells included in the assembled battery are connected in series; and
the at least one processor is configured to maintain a current value during the discharging of each of the cells.

8. A deterioration diagnosis method of an assembled battery, the deterioration diagnosis method comprising:
executing discharging of each of a plurality of cells included in the assembled battery in a vehicle while measuring a voltage of each of the cells, the vehicle including an internal combustion engine, a motor that executes start processing of the internal combustion engine, and the assembled battery that supplies power to the motor;

repeatedly determining, during the discharging of each of the cells, whether the assembled battery becomes unable to supply power required for the start processing to a motor when the discharging is continued;

ending the discharging upon determining, during the discharging of each of the cells, that the assembled battery becomes unable to supply the power required for the start processing to the motor when the discharging is continued; and estimating, after the end of the discharging, a deterioration degree of the assembled battery using voltage data indicating a transition of a voltage of at least one of the cells from a discharging start voltage to a predetermined discharging end voltage, which is acquired during the discharging, of the at least one of the cells;

wherein the method further comprises:
ending the discharging when any of a first end condition and a second end condition is satisfied, the first end condition being satisfied when voltages of all the cells included in the assembled battery reach the discharging end voltage, and the second end condition being satisfied when a determination is made that the assembled battery becomes unable to supply the power required for the start processing to the motor when the discharging is continued;

estimating, when the discharging is ended by the satisfaction of the first end condition, the deterioration degree of the assembled battery using voltage data of all the cells included in the assembled battery; and estimating, when the discharging is ended by the satisfaction of the second end condition, the deterioration degree of the assembled battery using voltage data of a cell of which a voltage reaches the discharging end voltage before the end of the discharging.

9. The deterioration diagnosis method according to claim 8, further comprising:
- determining, using the estimated deterioration degree of the assembled battery, whether use of the assembled battery in the vehicle is continuable;
- executing, by the motor, the start processing of the internal combustion engine upon determining that the use of the assembled battery in the vehicle is continuable; and
- charging the assembled battery with power that is generated using drive power output from the started internal combustion engine.

10. A deterioration diagnosis apparatus of an assembled battery, the deterioration diagnosis apparatus comprising at least one processor configured to:
- execute discharging of each of a plurality of cells included in the assembled battery mounted on a vehicle while measuring a voltage of each of the cells; and
- estimate a deterioration degree of the assembled battery using voltage data indicating a transition of a voltage of at least one of the cells from a discharging start voltage to a predetermined discharging end voltage, wherein:
- the vehicle includes an internal combustion engine and a motor that executes start processing of the internal combustion engine;
- the assembled battery is configured to supply power to the motor;
- the at least one processor is configured to determine, during the discharging of each of the cells, whether the assembled battery becomes unable to supply power required for the start processing to the motor when the discharging is continued, and end the discharging before the assembled battery becomes unable to supply the power required for the start processing to the motor; and
- the at least one processor is configured to:
  - estimate a full charge capacity of each of the cells using the voltage data,
  - classify, based on the estimated full charge capacity, the cells into any of a first category, a second category having a larger full charge capacity than the first category, and a third category having a larger full charge capacity than the second category;
  - determine that the assembled battery is new when all the cells of which the voltages reach the discharging end voltage before the end of the discharging are classified into the third category; and
  - determine that use of the assembled battery in the vehicle is not continuable when at least one of the cells of which the voltages reach the discharging end voltage before the end of the discharging is classified into the first category.

* * * * *